(12) United States Patent
Dittus

(10) Patent No.: US 11,831,112 B2
(45) Date of Patent: *Nov. 28, 2023

(54) COMBINATION OUTLET ASSEMBLY AND POWER DISTRIBUTION UNIT INCLUDING THE SAME

(71) Applicant: CIS Global LLC, Tucson, AZ (US)

(72) Inventor: Karl Klaus Dittus, Raleigh, NC (US)

(73) Assignee: CIS GLOBAL LLC, Tucson, AZ (US)

( * ) Notice: Subject to any disclaimer, the term of this patent is extended or adjusted under 35 U.S.C. 154(b) by 71 days.

This patent is subject to a terminal disclaimer.

(21) Appl. No.: 17/694,379

(22) Filed: Mar. 14, 2022

(65) Prior Publication Data

US 2022/0200218 A1 Jun. 23, 2022

Related U.S. Application Data

(63) Continuation of application No. 17/070,336, filed on Oct. 14, 2020, now Pat. No. 11,276,970.

(51) Int. Cl.
| | |
|---|---|
| *H01R 13/506* | (2006.01) |
| *H01R 24/78* | (2011.01) |
| *H01R 13/514* | (2006.01) |
| *H01R 27/00* | (2006.01) |
| *H01R 105/00* | (2006.01) |

(52) U.S. Cl.
CPC .......... *H01R 24/78* (2013.01); *H01R 13/506* (2013.01); *H01R 13/514* (2013.01); *H01R 27/00* (2013.01); *H01R 2105/00* (2013.01)

(58) Field of Classification Search
None
See application file for complete search history.

(56) References Cited

U.S. PATENT DOCUMENTS

| 6,220,880 B1 | 4/2001 | Lee et al. |
|---|---|---|
| 7,753,682 B2 | 7/2010 | Gerard |

(Continued)

FOREIGN PATENT DOCUMENTS

| DE | 102017123704 A1 | 4/2019 |
|---|---|---|
| JP | 2003257523 A | 9/2003 |

OTHER PUBLICATIONS

"Vertiv combines the C13 and C19 outlets into one, supporting both C14 and C20 plug types", News Release, Vertiv, Mar. 31, 2020, 2 pages, accessed online at URL: https://www.vertiv.com/en-us/about/news-and-insights/corporate-news/vertiv-introduces-new-combination-outlet-for-geist-rack-pdus-to-simplify-it-equipment-provisioning-and-upgrades-in-the-americas/.

(Continued)

*Primary Examiner* — Tho D Ta
(74) *Attorney, Agent, or Firm* — QUARLES & BRADY LLP

(57) ABSTRACT

A combination outlet assembly includes a single piece integrally formed housing having first and second outlet cores respectively having a similar outer shape and profile but differently shaped sets of three terminal apertures, and three terminals associated with each respective set of three terminal apertures in the first outlet core and the second outlet core. The first outlet core and the second outlet core may be interchangeably used with power cord plug connectors of different types. Power cord latching features are also described. Power distribution units may include a number of combination outlet assemblies ganged together.

20 Claims, 16 Drawing Sheets

(56) References Cited

U.S. PATENT DOCUMENTS

| | | | |
|---|---|---|---|
| 8,038,454 B2 * | 10/2011 | Jiang | H01R 25/003 439/106 |
| 8,212,388 B2 | 7/2012 | Langgood et al. | |
| 8,283,802 B2 | 10/2012 | Jansma et al. | |
| 8,896,150 B1 | 11/2014 | Shammoh | |
| 9,356,409 B2 | 5/2016 | Jansma et al. | |
| 9,484,692 B2 * | 11/2016 | Irons | H01R 27/02 |
| 9,660,394 B2 | 5/2017 | Zien et al. | |
| 9,837,753 B1 | 12/2017 | Chen | |
| 10,249,998 B2 * | 4/2019 | Irons | H01R 25/003 |
| 10,374,361 B1 * | 8/2019 | Lien | H01R 24/68 |
| 10,498,096 B2 | 12/2019 | Irons et al. | |
| 10,541,501 B2 | 1/2020 | Hutchison et al. | |
| 10,680,398 B1 | 6/2020 | Irons et al. | |
| 11,276,970 B1 * | 3/2022 | Dittus | H01R 27/00 |
| 2007/0099458 A1 | 5/2007 | Gottstein | |
| 2008/0286995 A1 | 11/2008 | Greenberg | |
| 2014/0126116 A1 | 5/2014 | Irons | |
| 2015/0263447 A1 | 9/2015 | Liao | |
| 2016/0254628 A1 | 9/2016 | Liao | |
| 2018/0083387 A1 | 3/2018 | Preuss et al. | |
| 2019/0341724 A1 | 11/2019 | Utz et al. | |
| 2021/0050696 A1 | 2/2021 | Vaze | |
| 2021/0057859 A1 | 2/2021 | Irons et al. | |

OTHER PUBLICATIONS

"Vertiv Geist Combination Outlet C13 / C19", Handout, SL-20833, 2020, Vertiv, 1 page, accessed online at URL: https://www.vertiv.com/4a1d35/globalassets/products/critical-power/power-distribution/vertiv-geist-combination-outlet-c13-c19-handout.pdf.

"Vertiv Geist Launches Patented Combination Outlet C13 / C19 on Rack PDU", Webpage, Vertiv, retrieved on Oct. 7, 2021 from URL: https://www.vertiv.com/en-emea/products/brands/geist/vertiv-geist-launches-patented-combination-outlet-c13--c19-on-rack-pdu/.

Retention Solutions, "Prevent your devices' cables from accidentally unplugging" product sheet, Server Technology, 2019.

Server Technology, Part No. KIT-0013 product sheet, www.servertech.com, Dec. 18, 2013.

\* cited by examiner

COMBINATION OUTLET ASSEMBLY AND POWER DISTRIBUTION UNIT INCLUDING THE SAME

CROSS-REFERENCE TO RELATED APPLICATION

The present application is a continuation of U.S. application Ser. No. 17/070,336, filed Oct. 14, 2020, which is hereby incorporated by reference in its entirety.

BACKGROUND OF THE INVENTION

The field of the invention relates generally to electrical outlets operable interchangeably with a combination of different types of mating plug connectors, and more specifically to a combination outlet assembly for an industrial power distribution unit.

Computer data center applications typically include a plurality of computer servers arranged in server racks or cabinets. Power distribution units (PDUs) are known to include a number of power outlets distributed along a chassis of the PDU for respective connection to components and equipment arranged on the server rack. The respective PDUs receive input power from the same power source or different power sources, and distribute output power to the power outlets provided. Power cords of equipment in the server racks or cabinets may be plugged in to the PDU. State of the art PDUs also intelligently facilitate remote management of power distribution to critical equipment, power metering and monitoring features both local and remote from the PDU, power outlet switching on/off and local and remote controls, alarm features detecting and alerting of certain operating conditions, and other sophisticated features allowing adaptation of the PDU for particular power system applications distributing power to specific electrical components and equipment.

A variety of different types of plug connectors for power cords are known for use with different devices in the server rack or cabinet that are desirably served by industrial power distribution units. As such, PDUs including so-called combination outlets have recently been introduced wherein the same power outlets in the PDU may be interchangeably used with different types of plug connectors in different arrangements. Conventional combination outlets for PDUs are disadvantaged in some aspects, however, and further improvements are desired to more completely meet the needs of the marketplace.

BRIEF DESCRIPTION OF THE DRAWINGS

Non-limiting and non-exhaustive embodiments are described with reference to the following Figures, wherein like reference numerals refer to like parts throughout the various views unless otherwise specified.

DETAILED DESCRIPTION OF THE INVENTION

Figure 1:
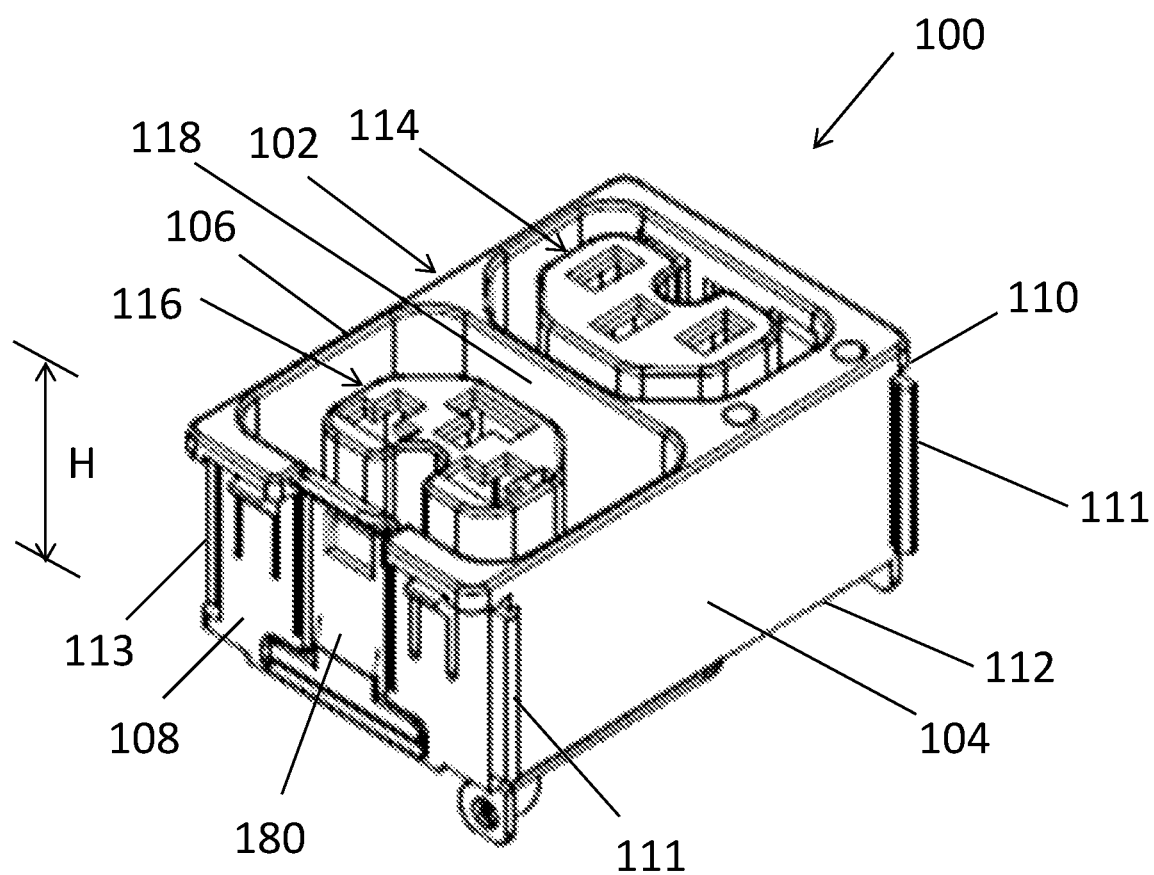
FIG. 1 is a top perspective view of a combination outlet assembly according to an exemplary embodiment of the present invention.

In order to understand the inventive concepts described below to their fullest extent, set forth below is a discussion of the state of the art and certain longstanding problems pertaining to industrial power distribution units (PDUs), followed by descriptions of exemplary inventive embodiments of PDU devices, systems and methods addressing longstanding problems in the art.

In general, an industrial PDU typically includes an elongated chassis with a large number of power outlets (e.g., 36 outlets) arranged along an axial length of the chassis, in combination with sophisticated power monitoring and power management components. The PDU may define a portion of a rather complex redundant power system in certain applications. For example, in a data center application, two power input paths may connect to respective sets of main power panels, transfer switches, backup generators, power panels, Maintenance Bypass Panels (MBP), uninterruptible power supplies, and branch protection circuit breakers feeding electrical power to the respective PDUs that in turn feed electrical power to information technology (IT) equipment and achieve multiple and redundant power supply operation of the IT equipment via the PDUs provided.

Each PDU in the data center application may be provided with "intelligent" features such as power metering, power control, environmental sensing, etc. of the PDU in use. A management module, sometimes referred to as a network management module, is therefore typically provided in the PDU that includes a simple computer or controller in communication with a network interface to realize bi-directional communication with a remote computer or computing network for purposes of monitoring and managing the power system in the data center. A number of different communication ports may be provided in a network interface including a Universal Serial Bus (USB) port, an Ethernet port, Rs485 ports, and sensor ports that may in turn interface with compatible cables and mating connectors in a known manner.

The management module in a conventional PDU may include a display that is local to the management module to show data and setup information at the PDU to the end user or installer, as well as responsible persons for overseeing the data center. The display in the management module may include a liquid crystal display (LCD) display screen, a light emitting diode (LED) display screen, and LCD/LED display screen, an organic light emitting diode (oLED) display screen, or another known type of display screen. The local display may be a single color display or multiple color display, may be provided with or without backlighting, and may be factory set to show critical power and setup information to the end user, installer or overseer as well as to display desired data and information after setup.

By virtue of the features described above, industrial PDUs are relatively large, sophisticated devices and therefore relatively expensive devices possessing vast functionality that so-called "power strip" devices cannot and will not provide. Power-strips are instead multi-outlet devices which, by design, are smaller, lighter, portable, and relatively inexpensive for powering non-critical electrical components for general business or residential use that do not require the power monitoring, power management, and data communication capabilities of an industrial PDU.

The various power outlets provided in a PDU may distribute electrical power from a common power supply input to a respective electrical component, electrical device, electrical appliance or electrical equipment via removable power cords. Each power cord has a plug connector on one end that interfaces with one of the outlets on the PDU and a second end that connects to the electrical device, electrical appliance or electrical equipment. Such PDUs and power cords are prolifically used for respective power connection to IT components and equipment arranged on the server rack in a computer data center.

A number of different types of plug connectors exist for power cords in the computer data center equipment realm. The plug connectors typically include terminals located inside an open-ended housing that may in turn be received over an outlet in a PDU in a safe and effective manner. The terminals of the plug connector pass through apertures in the outlet of the PDU and are received in mating terminals of the outlet to establish the desired electrical connection to the PDU while the housing of the plug connector extends over and receives the exterior surface of the PDU outlet. As such, conventional plug connectors and PDU outlets each have mating housing features and mating terminal features.

In contrast to a PDU, a conventional power strip device is designed for use with a standard plug having terminals projecting from an exterior of the plug housing that are mated with plug-in connection to internal terminals of an outlet, without positive engagement of the plug connector housing to any housing feature of the socket. The outlets in the power strip receive the terminals of a plug but the plug connector housing itself is not received in the outlets to establish the desired electrical connection. The power strip device that is generally designed for residential or business use is designed to operate with respect to standard plugs having standard terminals that are in turn universally used with a standard wall outlet in a modern residence or commercial building.

For instance, in the United States the standard wall outlet is a NEMA 5-15R, 15A outlet. The standard plug in the United States is either a NEMA 1-15P plug or a NEMA 5-15P plug. NEMA 1-15P and NEMA 5-15P plugs each include parallel and straight terminal blades, while the NEMA 5-15 plug further includes a terminal ground pin. The NEMA 1-15P and NEMA 5-15P plugs are commonly referred to in layman terms as a "two prong" plug or a "three prong" plug that are prolifically found in power cords and extension cords of a typical consumer electrical device or appliance. In general, any power cord including the standard plug can be plugged into the standard wall outlet and can alternatively be plugged in to the power strip device, whereas the plug connectors of certain types of data center equipment are entirely incompatible with the standard wall outlet due to the terminals being interior to the plug housing and due to interfering features of the plug connector housing and the standard wall outlet, and for the same reasons are incompatible with the standard outlets in a power strip device. From this perspective, and unlike the power strip device, the industrial PDU requires special purpose outlets rather than standard outlets in order to make the needed connections to IT equipment or other devices via power cords having special purpose plug connectors with incompatible housing and terminal features to the standard outlet design.

Different types of special purpose plug connectors are likewise known that include different plug connector housing shapes and different orientations of terminals inside the plug connector housing. Accordingly, different types of special outlets are known for PDUs that are specifically configured to connect to different types of special purpose connector plugs via compatible outlet shapes and terminal apertures with one of the different types of plug connectors available. Such different types of special purpose outlets have been used in conventional PDUs to connect with specific plug connector types in a one-to-one correlation. That is, each of the different types of special purpose outlets is generally configured to specifically connect to a different one of the particular and different types of plug connectors available. In other words, a plurality of different outlets have conventionally been provided in a PDU to correspondingly mate with different types of plug connectors, wherein a first type of outlet is provided to mate with a first type of plug connector, a second type of outlet is provided to mate with a second type of plug connector, etc.

Providing such different types of special purpose outlets in a conventional PDU to mate with different plug connector types is undesirable from the manufacturing perspective. Increasing the number of outlets in the PDU to provide a greater variety of power outlets having specific configuration to mate with power cords having different plug connector types requires a larger PDU and therefore increased material costs and assembly costs in the manufacturing of a PDU. While this may be acceptable to customers that can use the outlets provided in about the same number, in other cases such a PDU would be a poor fit for a customer that has no need for the number of combination outlets provided in the PDU. A possible solution would be to offer a number of stock keeping units (SKUs) of PDUs having different numbers of combination outlets, but increasing SKUs complicates the supply chain and requires additional costs to maintain an adequate inventory of PDUs to meet the needs of different customers.

Alternatively, customized PDU manufacturing is possible to meet the needs of customers specifically. Such customization of PDUs is undesirable in some aspects from each of the manufacturer's perspective and customer perspective. While customization of PDUs can be accommodated with some appeal to certain customers, it increases manufacturing costs and corresponding purchase prices. Different PDUs having the various different types of power outlets in different numbers for individual installations also entails a relatively complicated order process and opportunity for human error and mistake in the ordering and in the execution of the order by the manufacturer. Manufacturing delay and delivery delay for customized PDUs may also result in uneven timing of orders and inefficiencies of manufacturing customized PDUs.

From the purchaser's perspective, customization of PDUs can nonetheless undesirably result in a sub-optimal number of outlets for connection to the specific types of plug connectors for a particular end use either because the purchaser miscalculated the number of desired outlets of each type that is actually needed or because the needs changed due to unanticipated changes in the components being connected to the PDU or to unexpected types of power cords provided or on hand to make the desired connections. Considering that the connected plugs and IT equipment receiving power from the PDU may change over time in a data center, an otherwise acceptable PDU at the time of initial purchase and installation could suddenly become obsolete as the need to connect to different types of plug connectors changes.

Recently, PDUs have been introduced that include so-called combination outlets that are designed to facilitate electrical connections to different types of special purpose plug connectors in the same outlet. That is, by virtue of such combination outlets, different types of plug connectors having different plug housings and/or different terminal configurations can be interchangeably connected to the same outlet. This provides desired flexibility to make connections to various different types of plug connectors in a smaller number of outlets to reduce the size and expense of a PDU while affording greater flexibility from the installation perspective. Known combination outlets, however, can nonetheless be impractical in some aspects, undesirably limited in some aspects, undesirably complicated and expensive to manufacture, and/or subject to certain reliability issues in use. Improvements are accordingly desired.

Practical, simple, reliable and more economically manufactured combination outlet assemblies and power distribution units including combination outlet assemblies are described hereinbelow that address the shortcomings above. Method aspects will be in part apparent and in part explicitly discussed from the following description. While combination outlet assemblies and industrial PDUs including the same are described in the exemplary context of power distribution in computer data centers and data center equipment including IT equipment, such description is exemplary only and the embodiments of the invention are not necessarily limited thereto. Rather, the benefits of the inventive embodiments of combination outlet assemblies and PDUs accrue more generally to any end use or application presenting similar problems and in which at least some of the same benefits may be realized via the inventive concepts described herein.

Referring now to FIGS. 1-13, a combination outlet assembly 100 according to an exemplary embodiment of the present invention is shown in various views. The combination outlet assembly 100 has a compact package size including dual power outlets that are designed for interchangeable use with different special purpose plug connectors in a reduced amount of space and at an economical manufacturing cost relative to more complicated conventional combination assemblies having more than two outlets (e.g. four, six, eight, etc.) in a larger package size. The dual outlets in the assembly 100 are different and distinguishable from one another to accept different plug connectors in a different manner as described in detail further below. The combination outlet assembly 100 may be ganged together with other combination outlet assemblies 100 for installation to a PDU as also described below to economically provide a PDU having any desired number of combination outlets using a small number of modular component parts.

The combination outlet assembly 100 includes a housing 102 that in an exemplary embodiment is a single piece integrally formed housing including the features shown and described below. Specifically, in a contemplated embodiment the housing 102 may be formed and fabricated in a single piece construction via a molded, heavy duty plastic material. As compared to combination outlets including multiple piece housings that must be separately manufactured and subsequently assembled to one another, the single piece housing is advantageous from the manufacturing perspective to lower costs, while also avoiding reliability issues of separately fabricated housing parts detaching from one another in use and handling when attached to a PDU.

Figure 2:
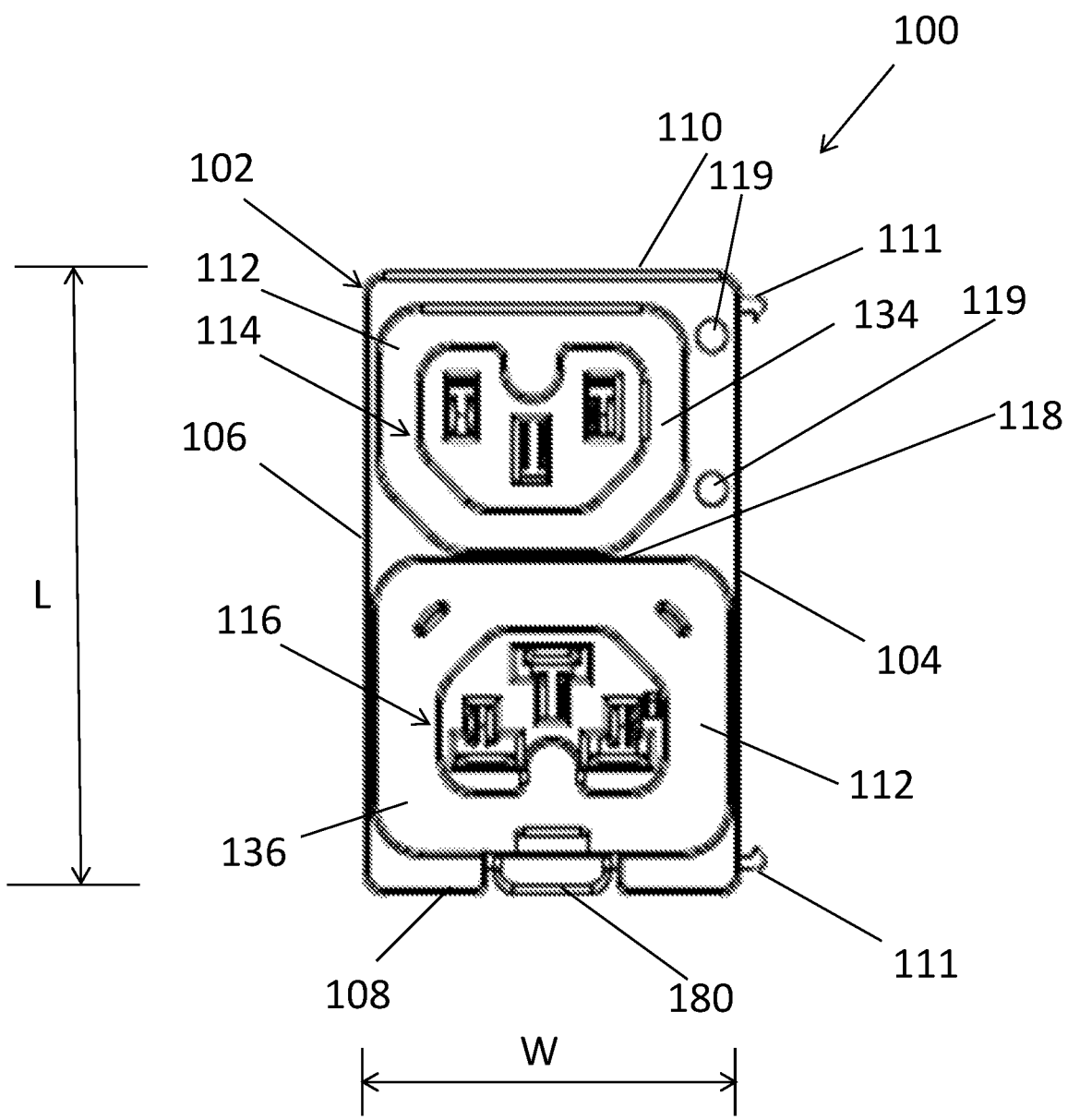
FIG. 2 is a top view of the exemplary combination outlet assembly shown in FIG. 1.

In the example embodiment shown the single piece housing 102 is defined by a pair of longitudinal side walls 104, 106 having respective first and second end edges, a pair of end walls 108, 110 extending orthogonally to the pair of longitudinal side walls 104, 106 and respectively interconnecting the first and second edges of the pair of longitudinal side walls 104, 106. A bottom wall 112 interconnects the pair of longitudinal side walls 104, 106 and the pair of end walls 108, 110. The side walls 104, 106, end walls 108, 110 and bottom wall 112 define a generally rectangular or box-like housing. As shown in FIG. 2, the longitudinal side walls 104, 106 have an axial length dimension L extending in a direction perpendicular to the end walls 108, 110 that is about twice as long as a width dimension W extending in direction perpendicular to the longitudinal side walls 104, 106.

Figure 14:
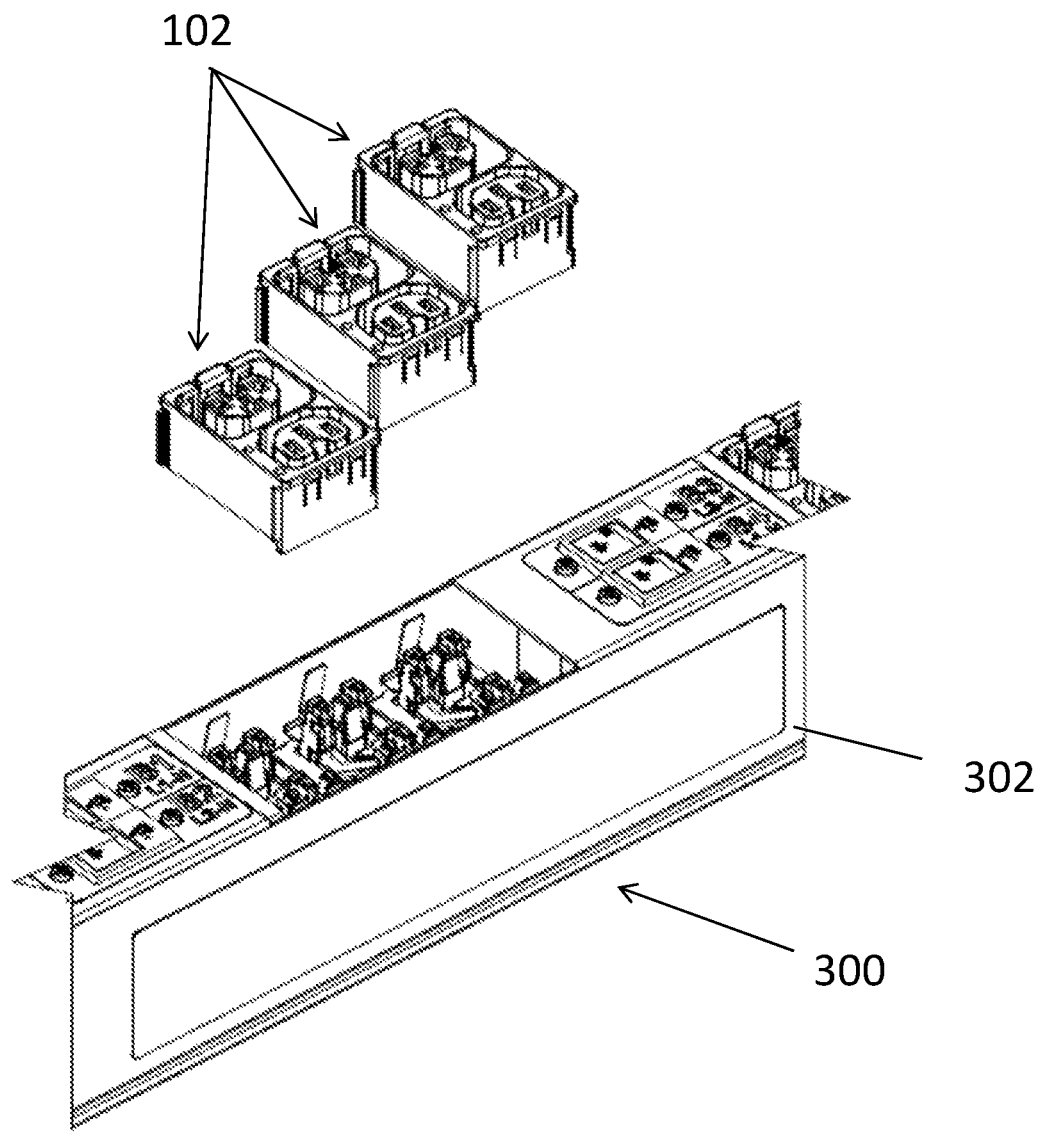
FIG. 14 is a partial assembly view of a portion of an exemplary power distribution unit including combination outlet assemblies as shown in FIGS. 1-13.
Figure 15:
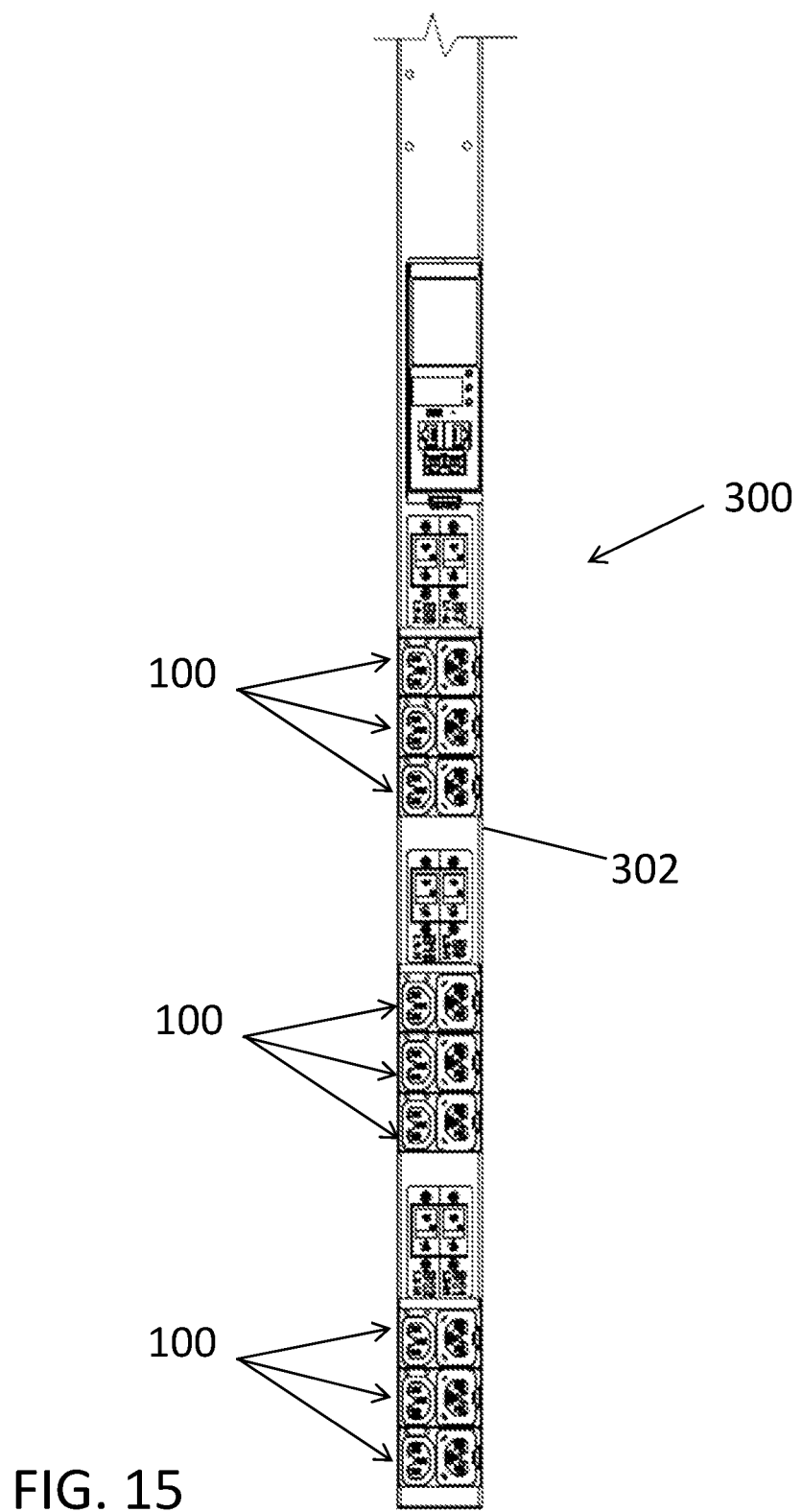
FIG. 15 is an enlarged partial assembly view of the power distribution unit shown in FIG. 14.

As shown in FIGS. 1, 2, 7 and 8, at the respective end edges thereof the longitudinal wall 104 further includes integrally formed vertically extending projections 111 extending parallel to a height dimension H of the housing 102. The longitudinal wall 106 includes integrally formed vertically extending grooves or slots 113 extending parallel to the height dimension H of the housing 102. As shown in FIG. 2, the projections 111 include hooks at the distal ends thereof. The projections 111 and slots 113 serve as ganging features wherein when two housings 102 are arranged side-by-side they may be positively interlocked to one another with a dovetail engagement of the projections 111 and grooves 113 as shown in FIGS. 14 and 15. While exemplary locations, orientations and geometry of ganging features are shown in the form of the projections 111 and slots 113, other locations, orientations and geometry is possible in alternative embodiments.

As shown in FIGS. 1, 2, 3, 5, 11 and 13 a first outlet core 114 is integrally formed in the housing 102 at an interior location to the walls 104, 106, 108 and 110 of the housing 102. The first outlet core 114 extends upwardly from the bottom wall 112. A second outlet core 116 is also integrally formed in the housing 102 at an interior location to the walls 104, 106, 108 and 110 of the housing 102. The second outlet core 116 extends upwardly from the bottom wall 112 in spaced relation from the first outlet core 114 along the length dimension L of the housing 102. An interior dividing wall 118 is formed in the housing 102 and extends between the outlet cores 114 and 116. In the example shown, the dividing wall 118 extends perpendicularly to the pair of longitudinal side walls 104, 106 and separates distinct regions on either side thereof wherein the core outlets 114, 116 reside. In other contemplated embodiments, however, the dividing wall 118 could be considered optional and need not be included while still realizing at least some of the benefits of the present invention.

In the illustrated example, the dividing wall 118 is slightly off-centered in the lengthwise dimension L of the single piece integrally formed housing 102. That is, the dividing wall 118 is slightly closer to one of the pair of end walls 108, 110 than to the other as shown in the top view of FIG. 2. Also, the outlet core 114 is slightly off-centered in the widthwise dimension W while the outlet core 116 is centered in the widthwise dimension W. That is, the outlet core 114 is positioned slightly closer to the longitudinal side wall 106 than to the side wall 104 of the housing 102 while the outlet core 116 is approximately equidistant from the longitudinal wall 104 and the longitudinal wall 106. The off-centered outlet core 114 in the widthwise direction accommodates fastener openings 119 alongside the outlet core 114 and the longitudinal side wall 104. The fastener openings 119 allow the housing 102 to be fastened to a support structure such as a chassis of a PDU using known fasteners such as screws that are received in the fastener openings 119 from above the housing 102. Coupled with the interlocking ganging features described above, the fasteners securely fix the combination outlet assembly 100 in place. In another embodiment, fastener openings may be located at an alternative location and/or the outlet core 114 could be centered and aligned with the outlet core 116 if desired.

Figure 3:
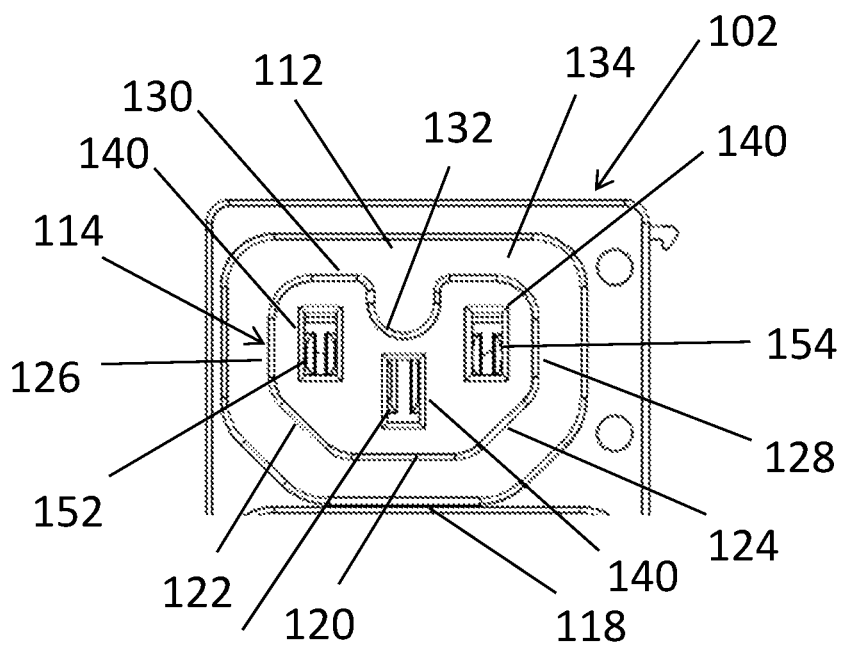
FIG. 3 is a magnified view of a first exemplary outlet in the combination outlet assembly shown in FIGS. 1 and 2.
Figure 5:
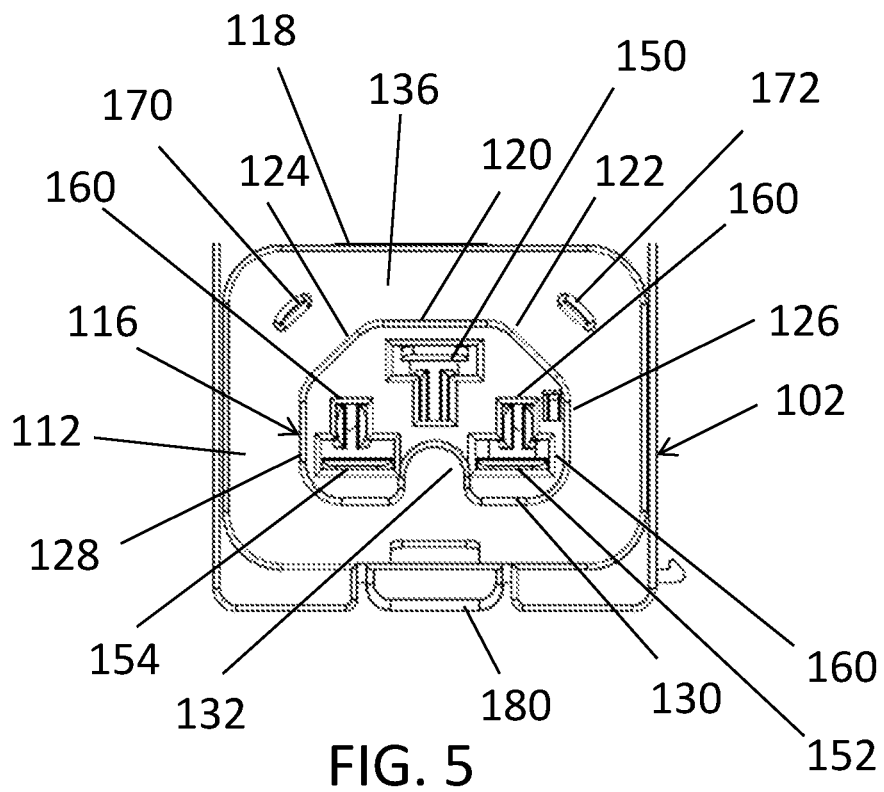
FIG. 5 is a magnified view of a second exemplary outlet in the combination outlet assembly shown in FIGS. 1 and 2.

As shown in FIGS. 2, 3 and 5, the first and second outlet cores 114, 116 respectively have a common outer shape and profile including a short end vertical wall 120 extending parallel to the dividing wall 118, a pair of vertical walls 122, 124 respectively extending at an obtuse but opposite angle to one another from the end wall 120 on either respective side of the vertical wall 120. As such, the slope of the angled walls 122, 124 is inverted on each side of the end wall 120. The outer shape and profile also includes a pair of side vertical walls 126, 128 extending parallel to the longitudinal side walls 104, 106 from the end of each angled wall 122, 124, and a long end wall 130 extending parallel to the short end wall 120 and interconnecting the ends of the parallel side walls 126, 128. A rounded internal groove 132 is also integrally formed in the long wall 130 in a central portion thereof that extends with concave curvature toward the short end wall 120. The vertical walls 120, 122, 124, 126, 128 and 130 of the outlet cores 114, 116 arranged as shown and described may be recognized as having the shape and profile of an IEC C13 inlet/receptacle familiar to those in the art. In combination with the groove 132 the outlet cores 114, 116 may be recognized as having the shape and profile of an IEC C15 inlet/receptacle also familiar to those in the art. While both the outlet cores 114, 116 have the same outer shape and profile in the illustrated embodiment, in another embodiment the outlet cores 114, 116 may be differently shaped and have a different profile from one another.

In the example shown, the outer shape and profile of the first and second outlet cores 114, 116 further extend as mirror images of one another in the lengthwise dimension L. In other words, and as shown in top view in FIG. 2 the outer shape and profile of the outlet core 114 is oriented in an inverted or upside down position (i.e., in a 180° orientation relative to the core outlet core 116) in the lengthwise dimension L. In the inverted arrangement, the short end wall 120 of each outlet core 114, 116 respectively faces the dividing wall and the long end walls 130 face the respective end walls 108, 110 of the housing 102. The outlet cores 114, 116 extend on opposing sides of the dividing wall 118 and the outlet core 114 extends slightly offset from the outlet core 116 in the widthwise dimension W. As a result, the outlet core 114 is shifted slightly to the left in FIG. 2 relative to the outlet core 116 and imparting an asymmetry in the housing 102 via slight staggering of the inverted outlet cores 114, 116. In other words, the inverted outlet cores 114, 116 are slightly misaligned with respect to an axial centerline of the housing 102 in the lengthwise direction. In another embodiment, however, the outlet cores 114, 116 need not necessarily be inverted or misaligned.

As shown in FIGS. 3 and 5, a respective receptacle space 134, 136 surrounds each of the first and second outlet core 114, 116 in the single piece integrally formed housing 102 via interior walls therein that are spaced from the outer shape and profile of each outlet core 114, 116. In the example shown, the space 134 that surrounds the outlet core 114 is shaped to complement the outer shape and profile of the outlet core 114. That is, the internal walls of the housing 102 surrounding the outlet core 114 include respective walls arranged complementary to but spaced from the outer walls 120, 122, 124, 126, 128 and 130 of the outlet core 114. The space 134 is defined by an inner boundary corresponding to the outer perimeter of the outer walls 120, 122, 124, 126, 128 and 130 of the outlet core 114 and an outer boundary having a larger perimeter but matching the shape of the inner boundary. The peripheral space 134 extends between the inner and outer boundaries to surround the entire circumferential perimeter of the outlet core 114.

Unlike the space 134, the space 136 that surrounds the outlet core 116 does not match the outer shape and profile of the outlet core 116. While the outlet core 116 has six walls 120, 122, 124, 126, 128 and 130 as shown, the housing internal walls surrounding the outlet core 116 include only four walls defining a generally rounded rectangular shape. As such, the space 136 has an inner boundary corresponding to the outer perimeter of the walls 120, 122, 124, 126, 128 and 130 of the outlet core 116 and an outer boundary that is nearly square. The outer boundary of the space 136 is therefore both larger than the inner boundary and differently shaped from the inner boundary. The area of the space 136 on the bottom wall 112 of the housing is considerably larger than the area of the space 134 as shown.

The receptacle space 134 surrounding the first outlet core 114 is compatible with a first power cord 200 (FIG. 4) having a first plug connector housing 202 that is complementary in outer shape and profile to the outlet core 114. The first plug connector housing 202 may accordingly be received over the outlet core 114 within the space 134 provided. The first plug connector housing 202 also includes three terminal blades 204 that extend in spaced apart but parallel planes inside the plug connector housing 202. The three terminal blades 204 correspond to a line terminal, a neutral terminal, and a ground terminal connecting to respective conductors in cable 206 of the power cord 200. The terminal and housing configuration of the plug of the power cord 200 shown in FIG. 4 may be recognized as an IEC C14 plug connector. When engaged, the terminals 204 in the plug connector housing 202 pass through rectangular apertures 140 (FIG. 3) in the outlet core 114 where they engage respective terminals 150, 152, 154 (FIGS. 3 and 13) that are located inside the outlet core 114 beneath the apertures 140.

Figure 6:
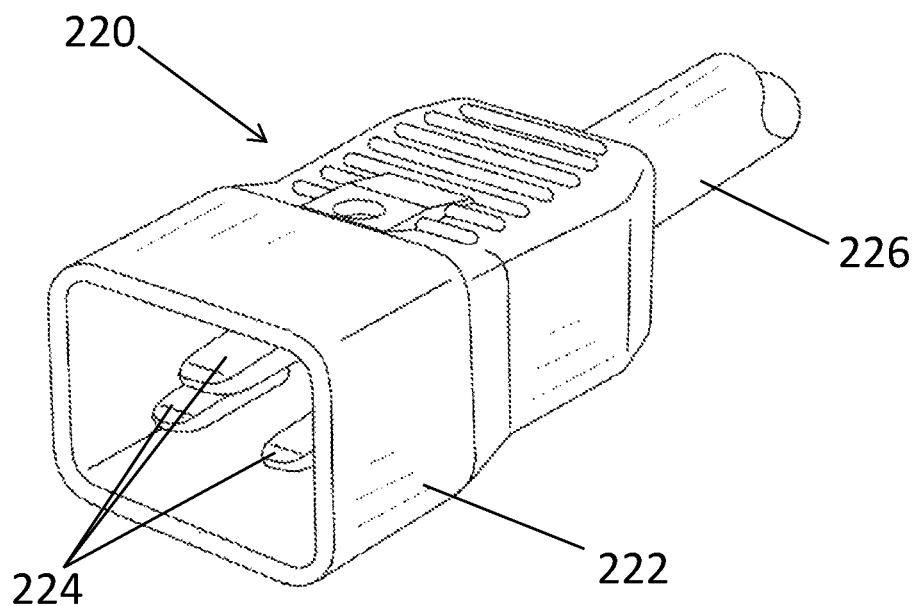
FIG. 6 is an exemplary perspective view of a second exemplary power cord and plug connector that may be connected only to the second outlet shown in FIG. 5.

As shown in FIG. 5, the space 136 surrounding the outlet core 116 in the housing 102, being both larger and differently shaped than the space 134 surrounding the outlet core 114, is compatible with the first plug connector housing 202 of the power cord 200 (FIG. 4) that is complementary in outer shape and profile to the outlet core 116, and further is compatible with a second plug connector housing 222 of a second power cord 220 shown in FIG. 6. The plug connector housing 222 includes four walls arranged in a generally square shape and terminals 224 inside the four walls. The four walls of the plug connector housing 222 may be received over the outlet core 116 within the space 136 provided.

Figure 4:
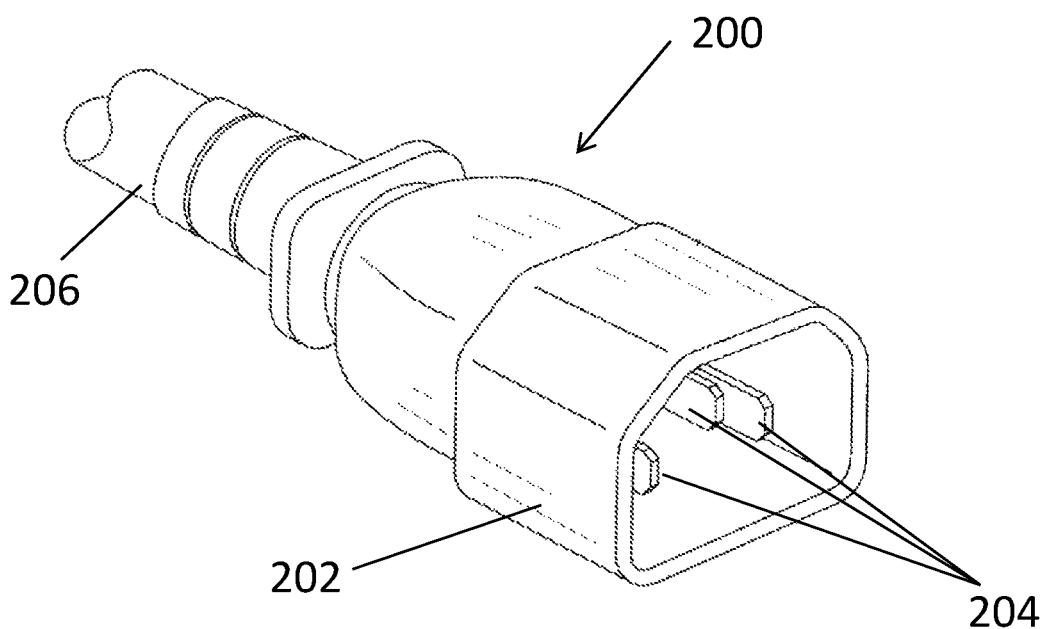
FIG. 4 is an exemplary perspective view of a first exemplary power cord and plug connector that may be connected to the first outlet and the second outlet shown in FIG. 3.

The second plug connector housing 222 also includes three terminal blades 224, two of which extend in a generally coplanar relationship and third extending in a spaced apart but parallel plane to the other two of the terminal blades 224. As such, each of the terminal blades 224 of the plug connector housing 222 inside the plug connector housing 222 extend at a 90° angle relative to the terminals 204 of the plug connector housing 202 of the power cord 200 (FIG. 4). Therefore, as shown in FIG. 4 the blade terminals 204 in the plug connector housing 202 extend at a common and generally vertical orientation, whereas the terminals 224 in the plug connector 222 as shown in FIG. 6 extend at a common and generally horizontal orientation. In alternative embodiments, one or more of the blade terminals in each plug connector housing may be oriented differently to another one of the blade terminals. By virtue of the different housing structure and/or the different terminal orientation such plug connectors are deemed to of different type in the context of the present invention.

The three terminal blades 224 in the plug connector housing 222 correspond to a line terminal, a neutral terminal, and a ground terminal connecting to respective conductors in cable 226 of the power cord 220. The terminal and housing configuration of the power cord plug shown in FIG. 6 may be recognized as an IEC C20 plug connector. When the power cord 220 is engaged to the outlet core 116, the terminals 224 in the plug connector housing 222 pass through respective horizontal portions of T-shaped apertures 160 (FIG. 5) in the outlet core 116 where they engage respective terminals 150, 152, 154 (FIGS. 5 and 13) that are located inside the outlet core 116 beneath the apertures 160. When the power cord 200 is engaged to the outlet core 116, the terminals 204 in the plug connector housing 202 pass through respective vertical portions of T-shaped apertures 160 in the outlet core 116 where they engage respective terminals 150, 152, 154 (FIGS. 5 and 13) that are located inside the outlet core 116. Therefore, by virtue of the outer shape and profile of the outlet core 216, the surrounding space 136, and the T-shaped apertures 160 in the core outlet core 116 both of the plug connector housing 202 and terminals 204 and the plug connector housing 222 and the terminals 224 may be interchangeably accepted by the outlet core 116 and engaged to the terminals 150, 152, 154 therein, whereas the outlet core 114 will accept the plug connector housing 202 and terminals 204 but reject the plug connector housing 222 and the terminals 224 due to interfering portions of the housing of the power cord 220.

In the illustrated embodiments, the outlet cores 114, 116 are respectively provided with the same sets of terminals 150, 152, 154. It is recognized, however, that the sets of terminals need not be the same in the outlet cores 114, 116 in another embodiment. Specifically, the outlet core 114 may be provided with simpler shaped terminals than those shown in FIG. 13 since the outlet core 114 includes the rectangular apertures 140 that would operate to reject a plug having incompatible terminals with the apertures 140. In other words, the terminals 150, 152, 154 that are configured to accept terminals of a plug in respectively different orientations are not required in the outlet core 114 because the apertures 140 will only accept plug terminals having a corresponding orientation. The benefits of the terminals 150, 152, 154 to accept different plug types in the outlet core 166 is only realized in the outlet core 116 having the T-shaped apertures 160. While exemplary terminals 150, 152, 154 are shown and described having capability to accept different plug types, other terminal configurations are possible and may be adopted in further and/or alternative embodiments.

It is also recognized that by virtue of the grooves 132 in each outlet core 114, 116, each of the outlet cores may also accept an IEC C16 plug that is similar to housing 202 of the power cord 200 and has similar terminals to the terminals 204, but further includes an internal protrusion that fits into the groove 132 in each outlet core. The outlet core 114 may therefore accept a C16 plug and a C14 plug but reject a C20 plug, while the outlet core 116 may accept a C14 plug, a C16 plug and a C20 plug. As such, the outlet core 114 may accept two different types of plugs while the outlet core 116 may accept three different types of plugs. The combination outlet assembly including only two outlet cores 114, 116 may therefore accept six combinations of mating plugs of different types. While exemplary plug types are described and illustrated having different housing structure and/or different terminal structure, such plug types are exemplary only and alternative types of plugs having plug connector housings of alternative geometry are possible having the same or different terminal structure of the IEC plug connectors described above in further and/or alternative embodiments.

As shown in FIG. 5, a pair of spaced apart projections 170, 172 extend upwardly from the bottom wall 112 of the housing 102 in the space 136 surrounding the outlet core. The pair of projections 170, 172 are located on the bottom wall 112 in spaced relation from the angled vertical walls 122, 124 of the outlet core 116 at a distance to respectively engage a portion of an exterior surface of the plug connector housing 202 (FIG. 4) when mated to the outlet core 116 or alternatively to engage an interior surface of the plug connector housing 222 (FIG. 6) when mated to the outlet core 116. In the example shown, the projection 170 is angularly oriented relative to the projection 172 on the bottom floor at about a 90° angle to contact and support adjacent portions of the plug connector housing 202 or 222 that is mated to the outlet core 116. The projections 170 and 172 that engage the plug connector housing 202 or 222 when received help to grip and hold the plug connector housing 202 or 222 in place and resist any tendency that otherwise may exist for the plug connector housing to disengage from the outlet core 116. The plug connector housing 202 in the complementary space 134 surrounding the outlet core 114 is less subject to being dislodged in a similar manner, although similar protrusions to the projections 170, 172 could be employed in the space 134 as well if desired. The projections 170, 172 are easily formed on the bottom wall 112 of the housing 102 with little additional material and negligible effect on the manufacturing cost of the housing 102. The projections 170, 172 are therefore more economical plug connector housings than much more elaborate housing features that utilize significantly greater amounts of housing material or require assembly of separately fabricated pieces to implement.

While an exemplary location and geometry has been described and illustrated for the projections 170, 172 the projections may be located elsewhere and may have different geometry in another embodiment. Also, a greater or fewer number of projections of the same or different shape and geometry may be utilized for similar purposes to the projections 170, 172 and to realize the benefits thereof to varying degrees.

As shown in FIGS. 1, 2, 5, 7, 8 and 11, to further ensure that a mated plug reliably stays connected to the outlet core 116, the end wall 108 of the single piece integrally formed housing 102 includes a deflectable latch portion 180. The deflectable latch portion 180 is attached to the housing 102 at a lower end thereof, but otherwise is separated from the end wall 108 of the housing 102 on the vertical sides thereof, and an angled finger grip extends away from the space 136 on the distal upper end of the deflectable latch portion 180. The latch portion 180 is formed with a latch opening 182 that accepts a latch protrusion (not shown) provided on a power cord in the plug connector housing 202 or 222. The associated plug and latch protrusion can therefore be positively locked or latched in place in the desired orientation relative to the outlet core 116.

A resilient spring element 184 (FIGS. 11 and 12) is separately provided from the housing 102 and may be fabricated from metal in a contemplated embodiment. The spring element 184 in the example shown includes a relatively wide base portion 186 in the widthwise dimension of the housing 102 that is inserted in a slot in the housing end wall 108 beneath the deflectable latch portion 180. The base portion 186 includes inwardly facing deflectable fingers in central portion thereof, and a relatively thin angled section 188 extending upwardly from an edge of the base portion 186. The upstanding angled section 188 abuts the deflectable latch portion 180 when assembled to the housing 102. The angled section 188 of the spring element 184 acts upon the deflectable latch portion 180 to apply an inwardly directed mechanical bias force to hold the deflectable latch portion 180 in a locked or latched position extending generally vertically and flush with the remainder of the end wall 108 of the housing 102. As a mating plug is inserted into the outlet core 116 the latch protrusion thereof will deflect the latch portion 180 outwardly until the latch protrusion can be received in the latch opening 182. When desired, a user may grasp or depress the upper end of the latch portion 180 and manually deflect it outwardly to release a latch protrusion and remove a connected plug from the outlet core 116 when desired. The lock protrusion in the power cord need not move relative to the power cord in order to engage or disengage the deflectable latch portion 180.

A similar opening to the latch opening 182 is provided in the end wall 110 of the housing 102 in the example shown, but the end wall 110 in the illustrated embodiment does not include a deflectable latch portion to assist with locking and unlocking of a power cord. The end wall 110 can still interface with a lock protrusion of a power cord, but requires a lock protrusion in the power cord that can be selectively positioned relative to the power cord housing to secure and release the lock protrusion with the lock opening in the end wall 110. The deflectable and non-deflectable latch openings in the housing 102 on the end walls 108, 110 provides additional flexibility in the combination outlet assembly to be used with different types of latch protrusions on power cords.

Instead of providing different latching features on each side of the housing 102, in further embodiments both of the housing end walls 108, 110 may be provided with a deflectable latch portion or a non-deflectable latch opening if desired. While the deflectable and non-deflectable latch features are illustrated on the end walls 106, 108 of the housing, in another embodiment the deflectable latch portion and the non-deflectable latch opening could be located on the longitudinal side walls 104, 106. Of course, in some embodiments wherein latching of power cords is not desired or needed, the latch features described could be omitted in the housing construction.

Figure 7:
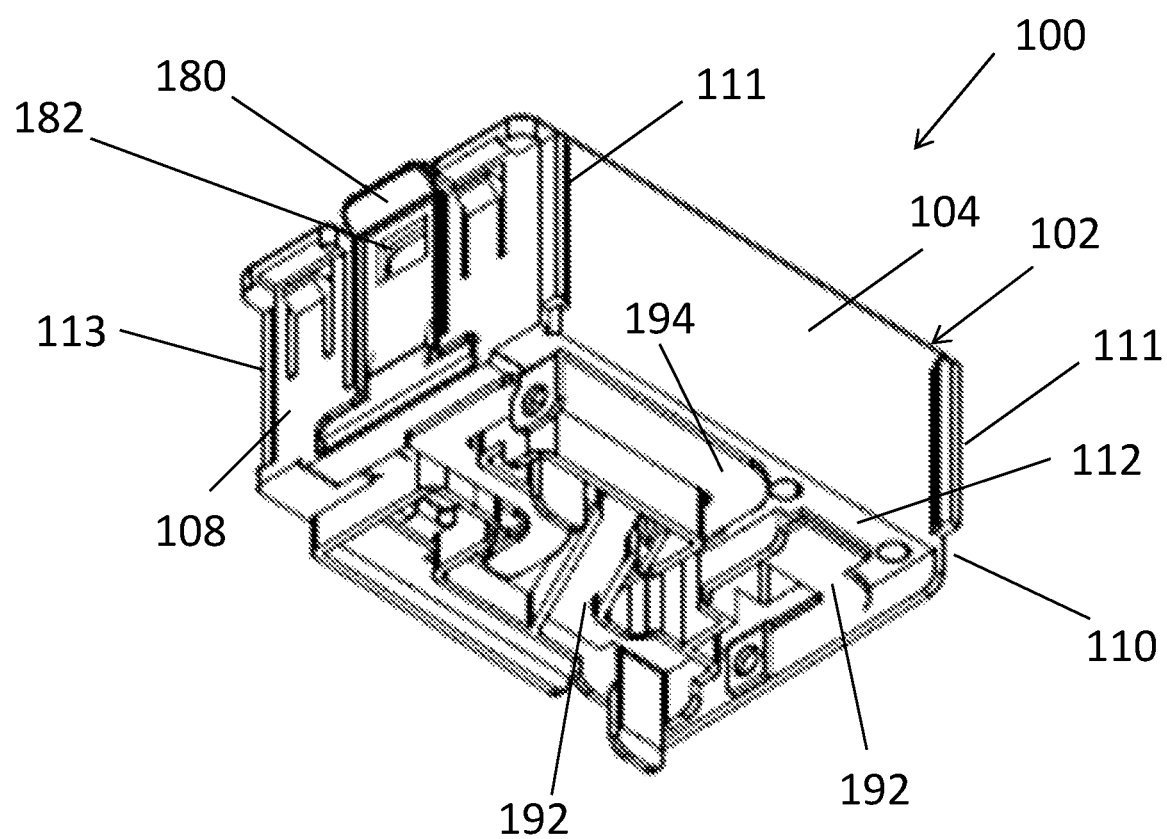
FIG. 7 is a bottom perspective view of the exemplary combination outlet assembly shown in FIG. 1.
Figure 8:
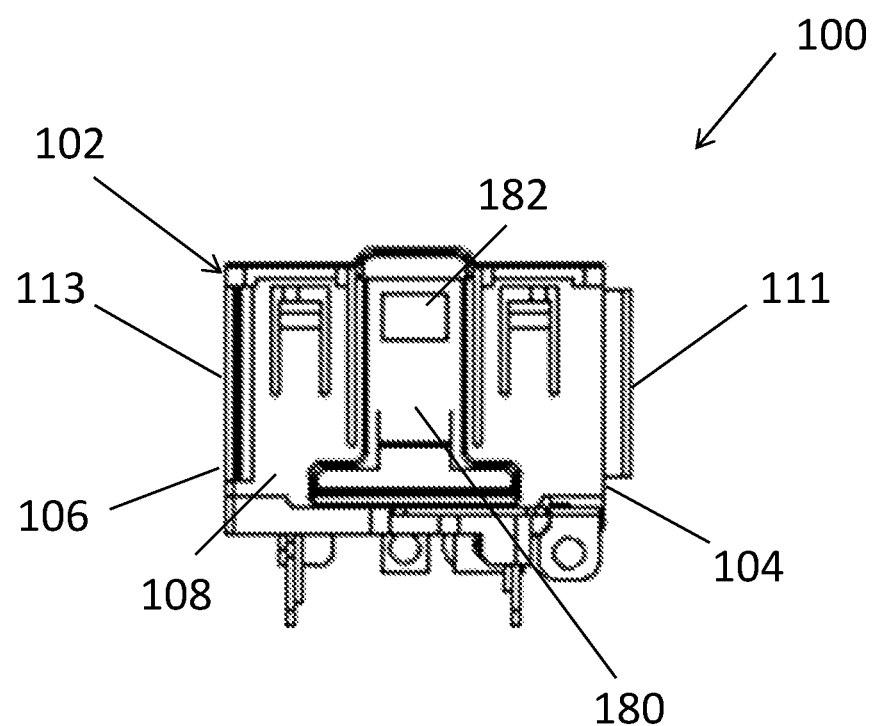
FIG. 8 is an end view of the exemplary combination outlet assembly shown in FIGS. 1 and 7.
Figure 9:
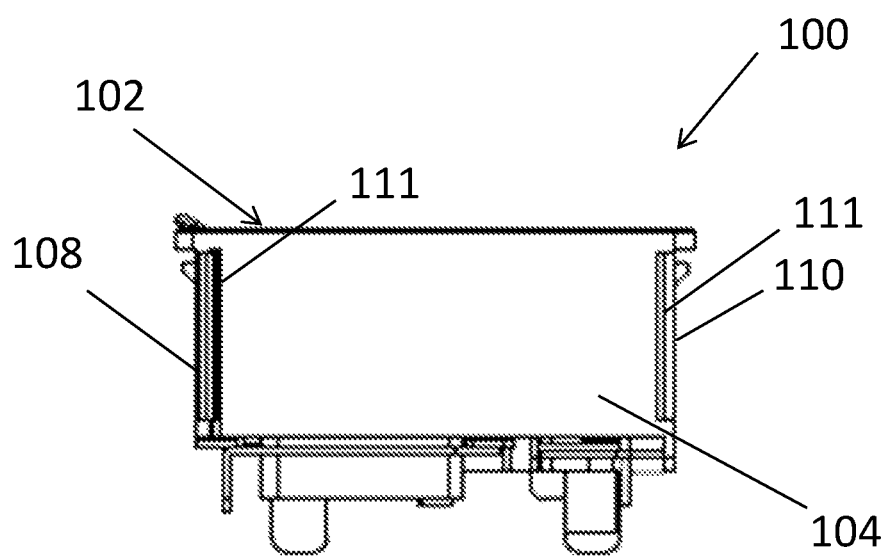
FIG. 9 is a side view of the exemplary combination outlet assembly shown in FIGS. 1 and 7.
Figure 10:
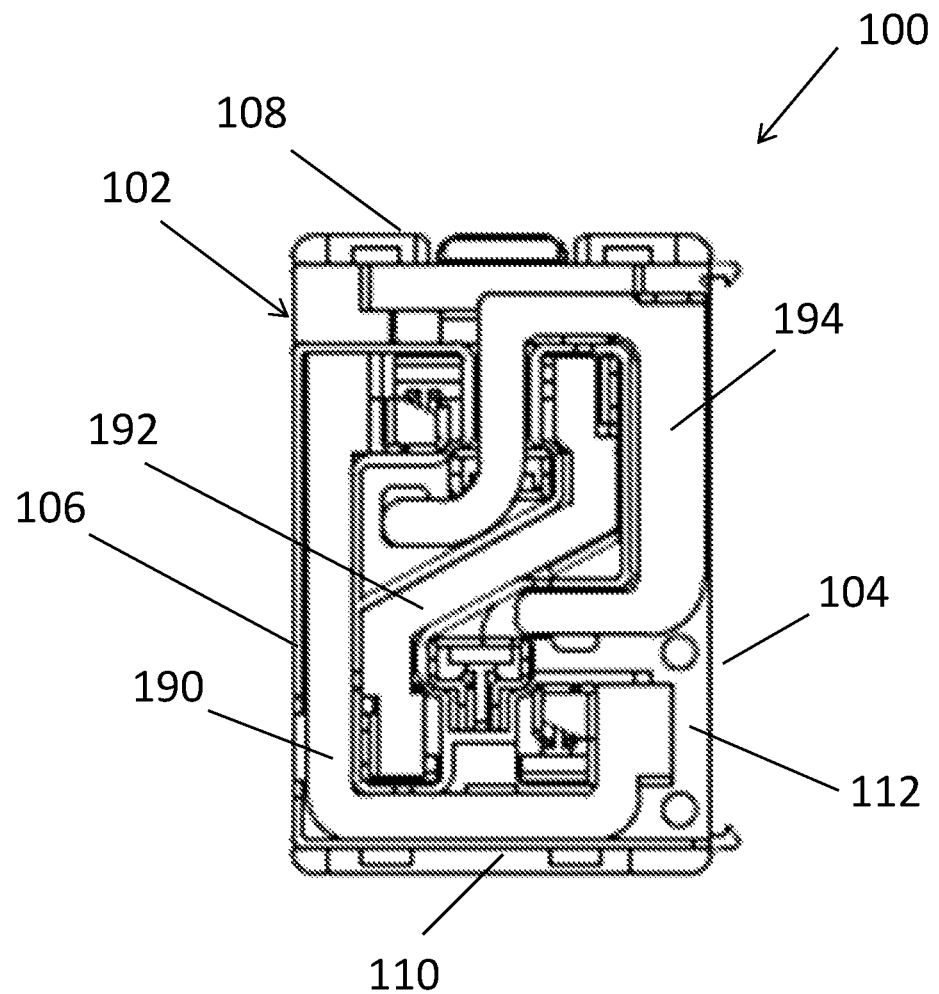
FIG. 10 is a bottom view of the exemplary combination outlet assembly shown in FIGS. 1 and 7.
Figure 11:
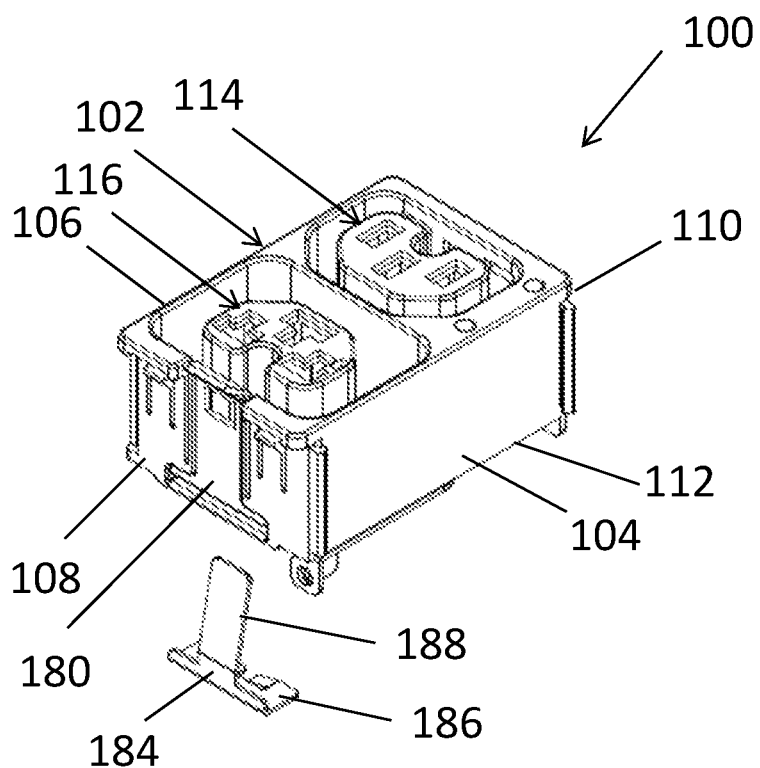
FIG. 11 is a first partial exploded view of the exemplary combination outlet assembly shown in FIG. 1.
Figure 12:
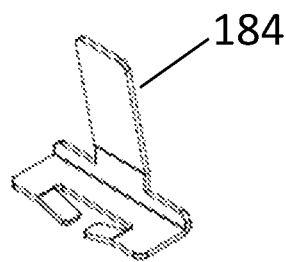
FIG. 12 is a perspective view of an exemplary power cord latch element for the combination outlet assembly shown in FIG. 11.
Figure 13:
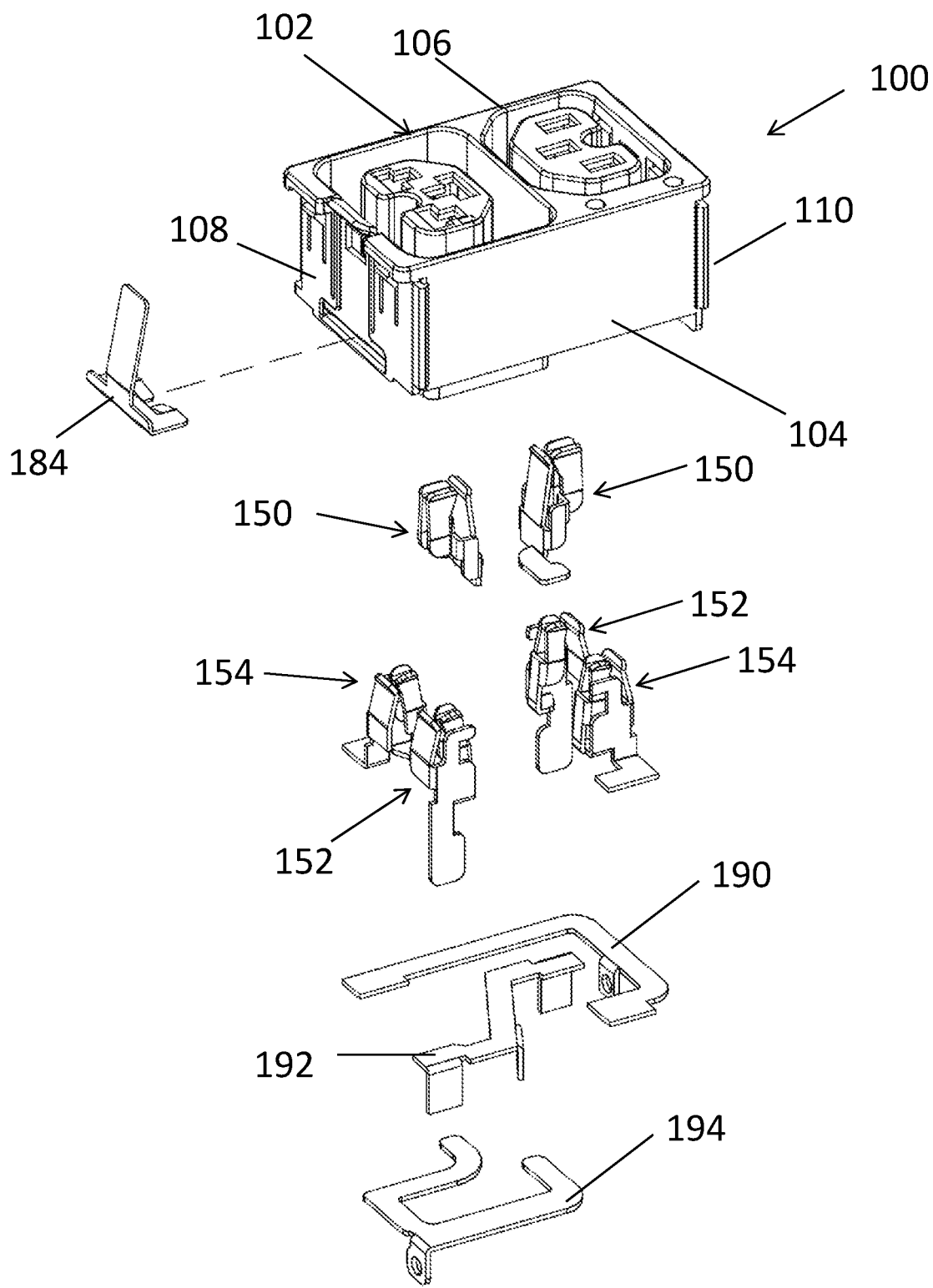
FIG. 13 is a full exploded view of the exemplary combination outlet assembly shown FIG. 1.

The combination outlet assembly 100 further includes, as shown in FIGS. 7, 10 and 13, conductor bus elements 190, 192, 194 interconnecting the respective terminals 150, 152, 154 associated with each of the outlet core 114 and the outlet core 116 on an exterior of the bottom wall 112. Each of the three conductor bus elements 190, 192, 194 completes a circuit path of different axial length between respective pairs of the terminals 150, 152, 154. The circuit path in each conductor bus element 190, 192, 194 connecting the terminals 150, 152, 154 is generally planar with a number of bends or angled transitions in each element 190, 192, 194.

In the illustrated embodiment, the conductor bus element 190 is an asymmetrical J-shaped element having a long leg and a short leg extending parallel thereto and a perpendicular leg interconnecting ends of the long and short legs. The opposing ends of the conductor bus element 190 include sections of enlarged areas to complete mechanical and electrical connection to the terminals 154. The conductor bus element 192 in the example shown is a generally symmetrical element having opposing parallel legs offset from one another with an angled section in between, and out of plane tabs at the distal ends thereof for connection to the terminals 152. The conductor bus element 194 in the example shown is an asymmetrical element having an open rectangular shape with parallel distal ends for connection to the terminals 150. Each conductor bus element 190, 192, 194 also includes out of plane fastener tabs to fix the elements 190, 192, 194 in the desired orientation in the assembly and to complete electrical connection to corresponding bus structure in the chassis of a PDU. The conductor bus elements 190, 192, 194 and sets of terminals in each outlet core 114, 116 are mechanically and electrically connected to corresponding bus conductors in the PDU to complete respective line connections, neutral connections, and ground connections for power distribution to the power outlets provided in the PDU.

As best shown in FIG. 10, the conductor bus element 192 is nested partly between portions of the conductor bus element 194 and partly in the conductor bus element 190. That is, portions of the conductor bus elements 190 and 194 surround the conductor bus element in a relatively compact arrangement. The bottom wall 112 of the housing 102 is formed with separating wall sections to prevent electrical shorting between the conductor bus elements 190, 192, 194. The geometry and arrangement of the conductor bus elements 190, 192, 194 is exemplary only and alternative geometry and arrangement of conductor bus elements 190, 192, 194 may be employed in other embodiments.

In certain contemplated embodiments, the conductor bus elements 190, 192, 194 may be omitted in favor of connecting wires to establish electrical connections to external circuitry through the terminals 150, 152, 154 or in favor of a circuit board including circuitry to which the terminals 150, 152, 154 may be connected in a PDU. Variations and adaptations are possible in this regard to make the electrical connections in the combination outlet assembly 100 to line, neutral and ground circuits in a power system whether through a PDU or as a stand-alone outlet device mounted to another support structure (e.g., a wall, a cabinet, or other support structure).

Also in certain contemplated embodiments, less than the three conductor bus elements 190, 192, 194 shown may be provided. For example, only two the conductor bus elements shown may be provided to respectively interconnect the neutral terminal and the ground terminal of each outlet core 114, 116, while the line connections may be made separately to each line terminal in the outlet cores 114, 116 to desirably facilitate switched outlet capability in the outlets provided. As such, and because the line terminals in each outlet core 114, 116 are not connected by a conductor bus in such an embodiment, they may be selectively turned on or off from via connection or disconnection to the same or different power inputs as desired. For example, the line terminals in each outlet core 114, 116 may be connected to a circuit board and controls to selectively energize or de-energize the outlets either independently or in combination in a known manner. Alternatively, switching elements may be provided that are not implemented through a circuit board if desired.

In the illustrated example wherein all three of the conductor bus elements 190, 192, 194 are provided, however, the outlets are connected to the same power input and desired power metering is facilitated in a simpler manner at reduced cost albeit with more basic functionality than the aforementioned switched power arrangement involving only two of the three conductor bus elements described.

Figure 16:
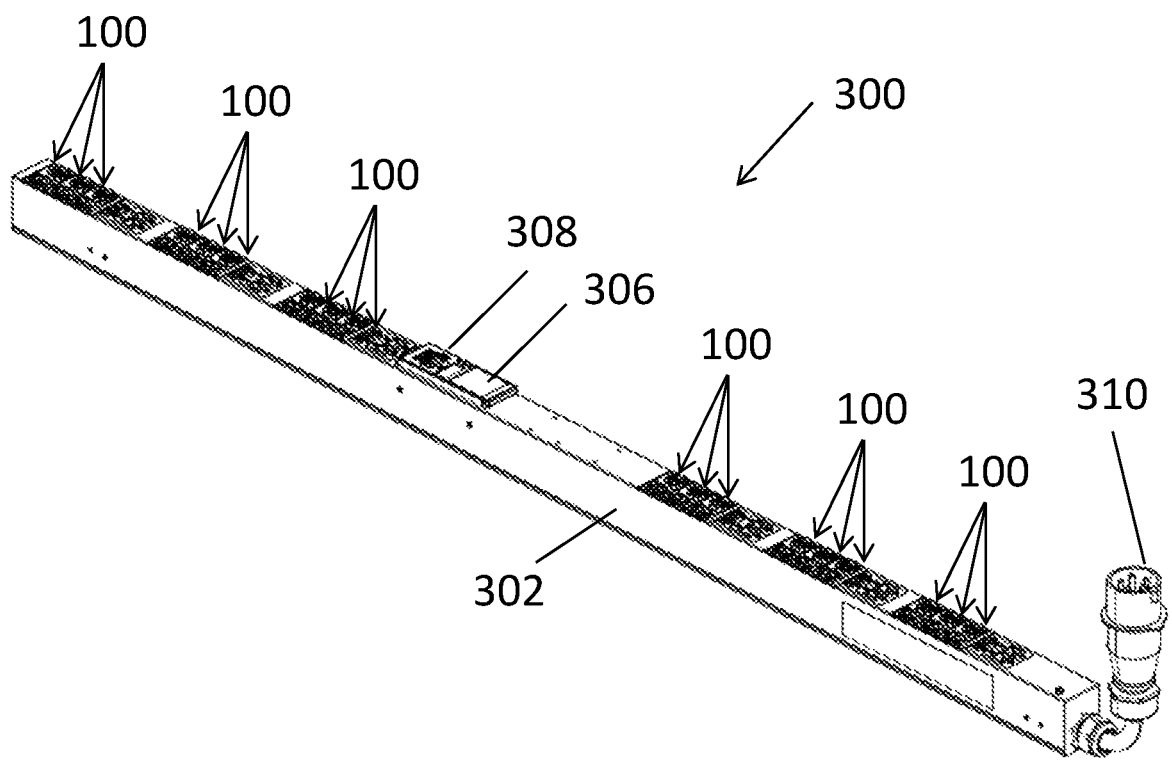
FIG. 16 is a perspective view of the complete power distribution unit shown in partial view in FIGS. 14 and 15.

As shown in FIGS. 14-16, a number of combination outlet assemblies 100 may be attached to a PDU 300. The PDU 300 includes an elongated chassis 302 having an opening 304 to receive the combination outlet assemblies 100 in a side-by-side manner with the housings 102 ganged together. In the example of FIG. 14 showing a small portion of the power distribution unit 300, the opening 304 is large enough to receive three combination outlet assemblies 100 with the housings 102 ganged together. The end walls 108, 110 of the housings 102 when attached extend parallel to the longitudinal walls of the PDU 300 in the axial lengthwise dimension of the PDU 300 while the longitudinal side walls 104, 106 extend perpendicularly to the longitudinal axis of the PDU 300. The inverted outlet cores 114, 116 in each housing 102 extend across the widthwise dimension of the PDU chassis.

Groups of three ganged combination outlet assemblies 100 are shown in FIG. 15 in spaced apart locations in the chassis 302 along the axial length of the PDU 300. In FIG. 16 three groups of ganged combination outlet assemblies 100 are shown in the PDU 300 on opposing sides of a management module 306 and communication interface 308 including various different types of communication ports and sensor ports such as those described above. A power cord 310 is provided at one end of the PDU to establish an input power connection to the PDU 300, with the outlets in the combination outlet assemblies 100 distributing power to electrical devices and equipment connected to the power outlets in the PDU 300.

The six groups of three combination outlets 100 in the PDU 300 shown in FIG. 16 corresponds to a total of eighteen combination outlet assemblies 100 and thirty six total outlets (eighteen outlets having the outlet core 114 and eighteen outlets having the outlet core 116) in the exemplary PDU 300. Since each combination outlet assembly 100 can accommodate six combinations of different plug types, the PDU 300 having the eighteen outlets can collectively facilitate one hundred and eight combinations) of different plug types (eighteen outlets times six combinations each) in a relatively compact package size. As such, the PDU 300 is less likely to disappoint purchasers that find the number of outlets to be too limited for the intended application, and also less likely to become obsolete due to changing needs over time. Further, the flexibility of the outlets provided to interchangeably connect to different power cord plug connectors accommodates changing needs or uncertainty in needs in particular PDU installations as well as more capably accommodates changing needs over time.

The management module 306 in the PDU 300 may include a display presenting power information and setup information to a PDU installer or data center overseer. The PDU 300 may include switches, sensors and other components to provide desired power management and metering functionality that can be accessed locally on the PDU via the management module 306 or communicated to or made accessible from the network interface 308. While the PDU shows an exemplary arrangement of outlets via the combination outlet assemblies 100 provided relative to the management module 308, other arrangements are possible in another embodiment. Also, while the PDU includes only combination outlets via the combination outlet assembly 100, still other types of outlets could be provided in addition to the combination outlets in the combination outlet assembly 100. Varying numbers of combination outlet assemblies 100 may be provided in different embodiments.

The combination outlet assembly 100 including the single piece housing 102 including the features described avoids more complicated multi-piece housing components to provide a combination outlet. Specifically, separately provided adapter pieces fitted to the outlet cores to configure them to accept or reject certain types of plug connectors are obviated by the single piece construction described and illustrated herein. As such adapter pieces are eliminated, any possibility for them to be lost or mislaid, or inadvertently broken or detached is avoided together with reliability issues or negative experiences by purchasers and installers who are frustrated by such issues.

The combination outlet assembly 100 including single piece housings 102 can provided in a modular form and easily be ganged together to scale a PDU to have as many combination outlets desired in an economical manner that generally avoids customization including custom fabricated housings and the like to provide different numbers of power outlets. Considerable variation in PDUs is therefore possible while using a small number of component parts to provide the combination outlet assembly 100. Of course, while the single piece housing 102 in the combination outlet described has considerable benefits, in alternative embodiments the housing 102 may be fabricated from more than one housing piece if desired while still realizing some of the other benefits described. Additionally, combination outlets having more than two outlets are possible in alternative embodiments having single piece or multi-piece housing constructions. Variations and adaptations are possible in this regard.

Figure 17:
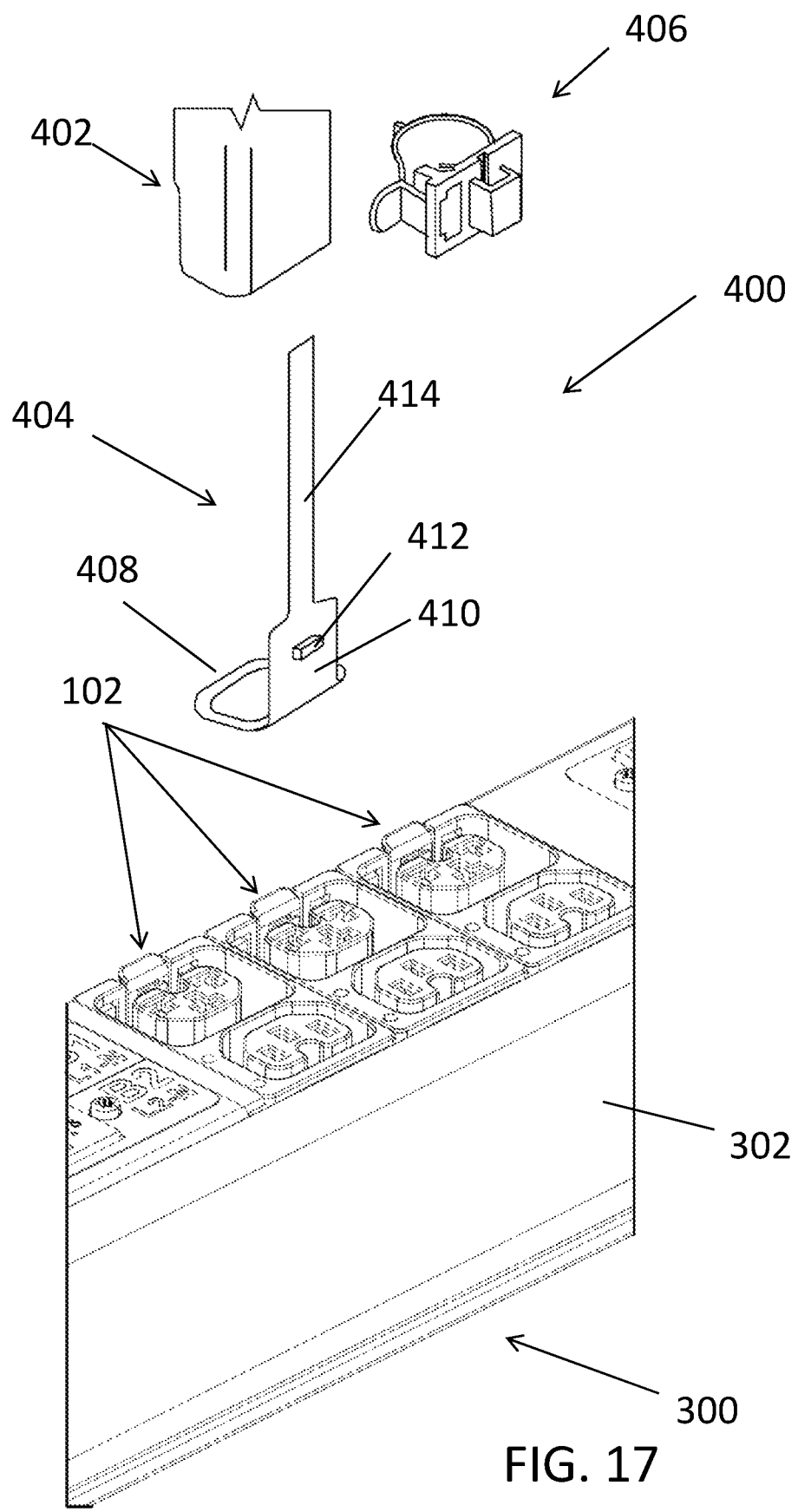
FIG. 17 is a partial exploded view of an exemplary power cord locking latch assembly for the power distribution unit assemblies shown in FIGS. 14 through 16 and including the combination outlet assemblies shown in FIGS. 1-13.
Figure 18:
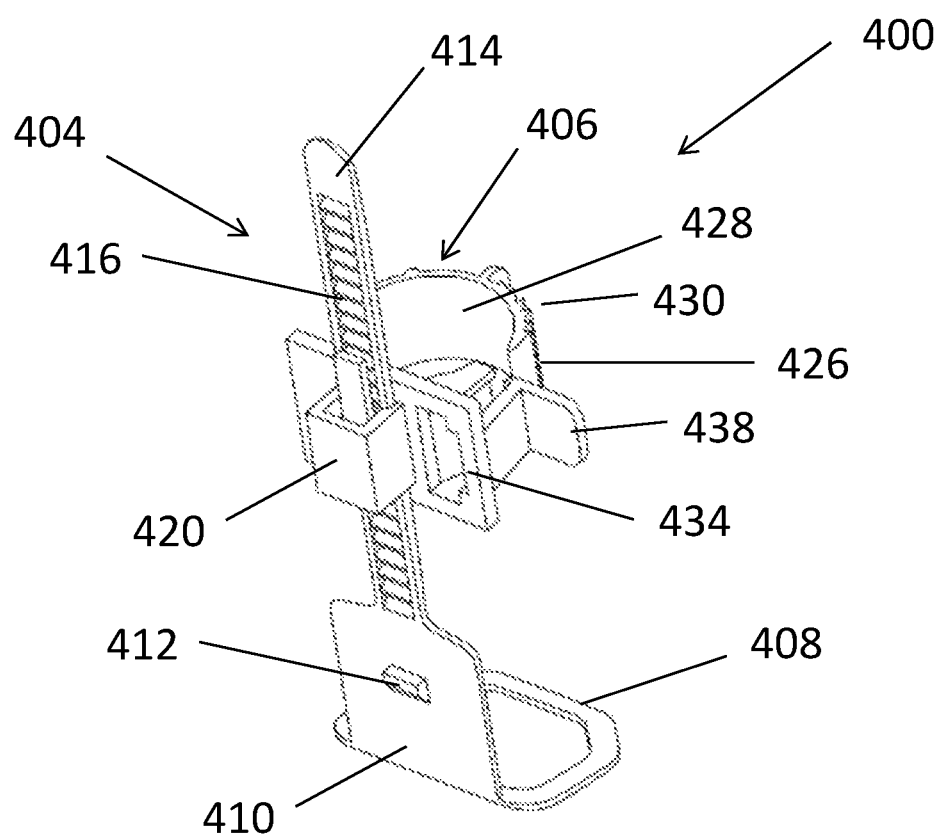
FIG. 18 is a perspective assembly view of the power cord locking latch assembly shown in FIG. 17.
Figure 19:
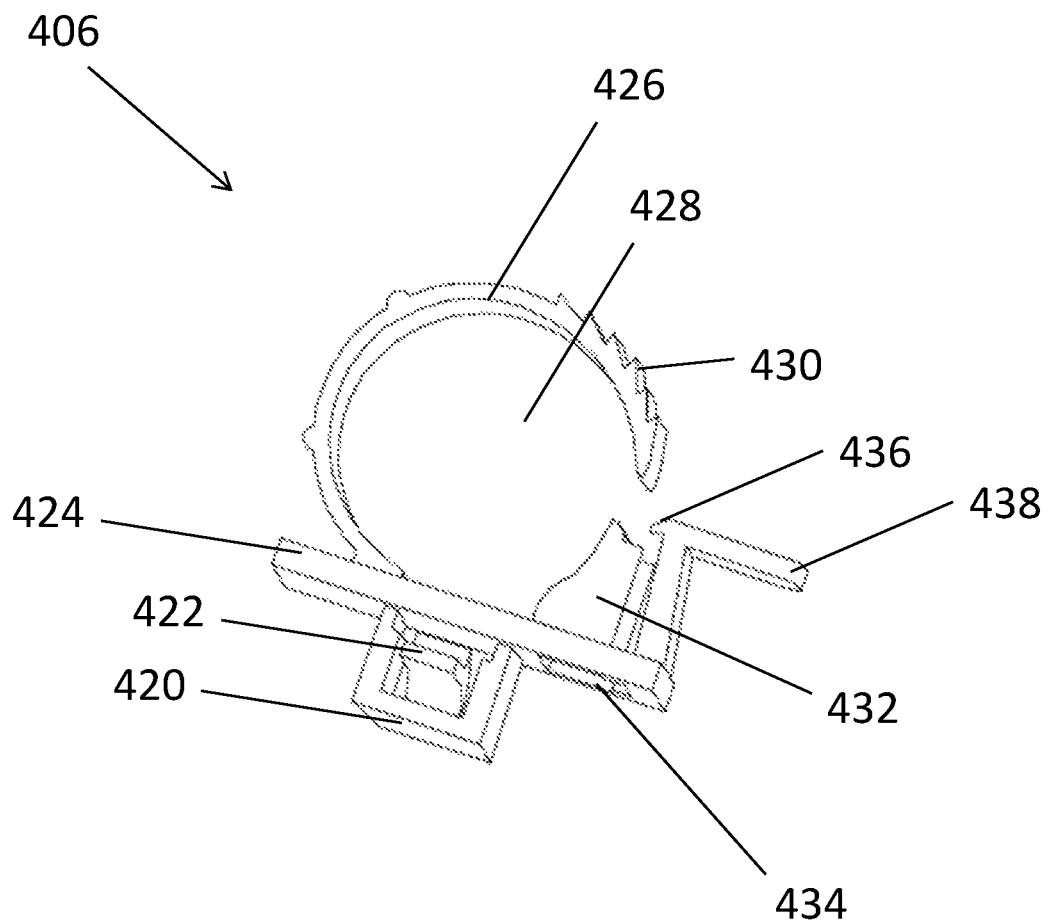
FIG. 19 is a perspective view of a portion of the power cord locking latch assembly shown in FIGS. 17 and 18.

FIGS. 17-19 illustrate an alternative power cord latch or locking assembly 400 that may be utilized with a combination outlet assembly 100 to reliably retain a power cord thereto. Unlike the lock or latching features described above in relation to deflectable and non-deflectable portions of the housing sidewalls in the combination outlet assembly 100, the power cord latch or locking assembly 400 may be utilized with a power cord 402 that does not include a lock protrusion at all. The power cord 402 may include any of the plug connector types described above without a lock protrusion, and therefore may be a more economical power cord.

The latch or locking assembly 400 includes a receptacle insert 404 and a power cord clamp 406. The insert 404 includes a planar rim 408 having a center opening therein with complementary shape to the outer shape and profile of the outlet cores 114, 116 in the combination outlet assembly 100. As such, the rim 408 may be inserted into the receptacle space 134 or 136 and be fitted around the outlet core 114 or 116 adjacent the bottom wall 112. The rim 408 may abut the protrusions 170, 172 in the bottom wall 112 of the housing 102 and therefore be gripped and retained in place in the housing 102 once installed.

A thin and rectangular locking tab 410 extends upwardly and generally perpendicularly from the rim 408, and the locking tab 410 includes a lock protrusion 412 that may be received in the lock opening of the housing end wall 108 or 110 described above. The thin locking tab 410 extends along the interior wall of the outlet core 114 or 116 without obstructing a power cord plug connector in the receptacle space 134 or 136. An elongated tether element 414 extends upwardly from the locking tab 410 and exterior to the receptacle space 134, 136. The tether element 414 includes a series of latch grooves 416 that may be gripped in an interlocking fashion to the power cord clamp 406.

As shown in FIG. 19, the power cord clamp 406 includes a rectangular collar 420 and a deflectable latch element 422 interior to the collar 420. The collar 420 may receive the tether element 414 and the latch element 422 may be lockingly engaged to one of the latch grooves 416 at the desired elevation. The clamp 406 further includes a support 424 and a round power cord grip 426 having a central opening 428 through which a portion of the power cord 402 may be passed. The power cord grip 426 is deflectable to restrict the size of the opening 428, and further includes a series of locking protrusions in the form of outwardly extending teeth 430 on a distal end thereof. When the distal end of the power cord grip 426 is deflected, it may be received in a latch housing 432 extending from the support 424 and lockingly engaged to a tooth 436 of a finger tab 438.

In use, with the latch element 422 of the clamp 406 engaged to the tether element 414 and with a portion of the power cord 402 in the clamp opening 428 the distal end of the power cord grip 426 can be deflected and received in the latch housing 432 by a desired amount to engage the tooth 436 of the finger tab 438 to one of the teeth 430 on the power cord grip 426. As the power cord grip 426 is deflected, the opening 428 is decreased and clamps the portion of the power cord 402 therein. If desired the distal end of the power cord grip 426 can be passed entirely though the latch housing 432 via an opening 434 to restrict the opening 428 even further. The opening 434 can be adjusted in size as needed to be clamped around a portion of the power cord plug housing or around a portion of the power cord cable. The locking insert 404 and the clamp 406 when engaged therefore provide positive locking of a power cord that does not include a lock protrusion while still preventing the power cord from dislodging.

When desired, the finger tab 438 of the clamp 406 can be used to deflect the locking tooth 436 outwardly in order to release the distal end of the power cord grip 426 to enlarge the opening 428 to the degree required to remove the power cord 402. The power cord 402 can therefore be removed while the power cord clamp 406 remains attached to the tether element 414 of the insert 404 and while the insert 404 remains in place in the housing 102. The adjustable power cord clamp 406 can be universally used with power cord having plugs of different types. While exemplary shapes and geometries of locking insert 404 and power cord grip 426 are shown and described, alternative geometry could be utilized in other embodiments to realize otherwise similar locking features. The insert 404 and clamp 406 may be fabricated from plastic materials in contemplated embodiments at relatively low cost. The insert 404 and clamp 406 provide event further flexibility to the combination outlet assembly 100 to be used with power cords having integral locking features and power cords without integral locking features while ensuring that connections to the power outlets are reliably secured maintained.

While the latch or locking assembly 400 with the receptacle insert 404 and power cord clamp 406 is described in combination with the combination outlet assembly 100, it is recognized that that latch or locking assembly 400 does not require the combination outlet assembly 100 and instead can be used apart from the combination outlet assembly 100 if desired. As such, the latch or locking assembly 400 may be used with power outlets other than those specifically described herein, whether or not configured as combination outlets that may be interchangeably connected to different power cords having different plug connector types. The rim 408 of the insert can be shaped to complement alternative outlet shapes to the outlet cores 114, 116 and different versions of inserts having different rims 408 can be provided to provide similar locking benefits to various different types of outlets to provide power cord locking features to power cord features that do not have integral locking features.

The benefits of the inventive concepts herein are now believed to have been amply illustrated in relation to the exemplary embodiments disclosed.

An embodiment of a combination outlet assembly has been disclosed including a single piece integrally formed housing. The housing includes a pair of longitudinal side walls having respective first and second ends, a pair of end walls extending orthogonally to the pair of longitudinal side walls and respective interconnecting the first and second edges of the pair of longitudinal side walls, a bottom wall interconnecting the pair of longitudinal side walls and the pair of end walls, a first outlet core extending upwardly from the bottom wall, and a second outlet core extending upwardly from the bottom wall. The first and second outlet cores respectively have a similar outer shape and profile but differently shaped sets of three terminal apertures, and three terminals associated with each respective set of three terminal apertures in the first outlet core and the second outlet core.

Optionally, the single piece integrally formed housing may further include a dividing wall extending between the first and second outlet cores. The dividing wall may be off-centered in the single piece integrally formed housing. The outer shape and profile of the first and second outlet cores may respectively extend as mirror images of one another on opposing sides of the dividing wall, and the first outlet core may be misaligned with the second outlet core.

As further options, at least two conductor bus elements may extend on an exterior of the bottom wall, the at least two conductor bus elements interconnecting respective first and second terminals associated with the first outlet core and the second outlet core. The at least two conductor bus elements may complete a circuit path of different axial length between respective ones of the first and second terminals associated with the first outlet core and the second outlet core. The at least two conductor bus elements may include three conductor bus elements, and a portion of one of the conductor bus elements may be nested between portions of the other conductor bus elements.

As additional options, a respective space surrounds each of the first and second outlet core in the single piece integrally formed housing, with the respective space that surrounds the first outlet core being shaped to complement the outer shape and profile and the respective space that surrounds the second outlet core being shaped to mismatch the outer shape and profile. The respective space surrounding the first outlet core may accept a first housing of a first plug connector type but reject a second housing of a second plug connector type, wherein the second housing of the second plug connector type is differently shaped from the first housing of the first plug connector type, and wherein the respective space surrounding the second outlet core may accept the first housing of the first connector type and also accept the second housing of the second connector type. The first plug connector type may include three terminal blades extending at a common first angular orientation inside the first housing, and the second plug connector type may include three terminal blades extending at a second angular orientation that is 90° from the first angular orientation. The shaped sets of three terminal apertures of the second outlet core may accept each of the three terminal blades of the first plug connector type and also may accept each of the three terminal blades of the second plug connector type. A pair of spaced apart projections may extend upwardly in the bottom wall in the space surrounding the second outlet core, with the pair of projections located on the bottom wall to engage an exterior surface of the first housing of the first plug connector type and also to engage an interior surface of the second housing of the second plug connector type. The first one of the pair of spaced apart projections may be angularly oriented relative to the second one of the pair of spaced apart projections on the bottom floor. The first one of the pair of spaced apart projections may be angularly oriented about 90° relative to the second one of the pair of spaced apart projections on the bottom floor.

Also optionally, one of the pair of end walls of the single piece integrally formed housing may include a deflectable latch portion including a latch opening. A spring may element acting upon the deflectable latch portion. Furthermore, one of the pair of end walls include may include a latch opening, and the combination outlet assembly may further include a separately fabricated latch insert having a latch protrusion configured to be received in the latch opening. The insert may further include an elongated a tether section including a series of latch grooves, and a power cord clamp may be attached to the tether section via one of the series of latch grooves, with the power cord clamp including a power cord grip including an opening being adjustably secured around a portion of a power cord.

The combination outlet assembly may optionally be provided in combination with a power distribution unit having a chassis and a management module, and the combination outlet assembly may be fastened to the chassis. A plurality of combination outlet assemblies may be ganged side-by-side in the power distribution unit.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A electrical outlet assembly comprising:
   an outlet module for modular assembly in a power distribution unit, the outlet module including:
   a single piece molded housing including walls that define a first receptacle space around a first outlet core and a second receptacle space around a second outlet core,
      wherein the first outlet core extends within the first receptacle space, includes a first outer profile to be received in a first plug housing, and further includes first terminal apertures in connection with connection with first-core terminals of the outlet module and configured to receive first plug terminals for connection with the first-core terminals of the outlet module, and
      wherein the second outlet core extends within the second receptacle space, includes a second outer profile shaped to be received in a second plug housing, and further includes second terminal apertures in connection with second-core terminals of the outlet module and configured to receive second plug terminals for connection with the second-core terminals of the outlet module; and
   a conductor bus element supported by the single piece molded housing and extending on an exterior of the housing to interconnect a set of terminals that includes a first terminal of the first-core terminals with a corresponding second terminal of the second-core terminals.

2. The electrical outlet assembly of claim 1, wherein the conductor bus element is a first conductor bus element and the set of terminals is a first set of terminals;
   wherein the electrical outlet assembly further comprises a second conductor bus element supported by the single piece molded housing and extending to interconnect a second set of terminals of the first-core and second-core terminals; and
   wherein a portion of the first conductor bus element is nested between portions of the second conductor bus element along a common wall of the single piece molded housing.

3. The electrical outlet assembly of claim 1, wherein the walls of the single piece molded housing include a dividing wall that extends between the first and second receptacle spaces; and
   wherein the dividing wall is off-centered on the single piece molded housing in a first direction, so that the first receptacle space is larger than the second receptacle space.

4. The electrical outlet assembly of claim 1, wherein a first wall of the walls of the single piece molded housing includes a deflectable latch portion adjacent to the first or second receptacle space; and
   wherein the outlet module further includes a latch element secured to the single piece molded housing, the latch element including a resilient latching section arranged to contact the deflectable latch portion to provide a bias force inwardly toward the first or second receptacle space.

5. The electrical outlet assembly of claim 4, wherein the latch element includes a latch insert section received within a latch opening of the single piece molded housing to secure the latch element to the single piece molded housing.

6. The electrical outlet assembly of claim 1, wherein a perimeter of the first receptacle space is complementary to the first outer profile of the first outlet core; and wherein a perimeter of the second receptacle space is not complementary to the second outer profile of the second outlet core.

7. The electrical outlet assembly of claim 1, wherein the first terminal is a ground terminal of the first-core terminals and the corresponding second terminal is a ground terminal of the second-core terminals.

8. The electrical outlet assembly of claim 7, wherein the first outlet core is spaced apart from the second outlet core in a first direction; and wherein the first outlet core is offset relative to the second outlet core in a second direction that is transverse to the first direction, so that the ground terminal of the first-core terminals is offset from the ground terminal of the second-core terminals relative to the second direction.

9. The electrical outlet assembly of claim 1, wherein the conductor bus element extends along an exterior of the single piece molded housing to interconnect the first terminal with the second terminal.

10. The electrical outlet assembly of claim 9, wherein the conductor bus element is a first conductor bus element and the set of terminals is a first set of terminals;

wherein the electrical outlet assembly further comprises a second conductor bus element supported by the single piece molded housing and extending to interconnect a second set of the first-core and second-core terminals; and wherein the single piece molded housing includes a separating wall section that protrudes from an exterior wall of the single piece molded housing between the first conductor bus element and the second conductor bus elements.

11. The electrical outlet assembly of claim 1, wherein the conductor bus element is a first conductor bus element and the set of terminals is a first set of terminals;

wherein the electrical outlet assembly further comprises a second conductor bus element supported by the single piece molded housing and extending to interconnect a second set of terminals of the first-core and second-core terminals;

and wherein the second conductor bus elements defines an open shape;

wherein the first conductor bus element includes a first connection to the first terminal and a second connection to the corresponding second terminal, with the first connection arranged inside of the open shape and the second connection arranged outside of the open shape.

12. The electrical outlet assembly of claim 11, wherein the first conductor bus element includes a connecting section that extends between the first connection and the second connection; and wherein a first connection of the first conductor bus element to the second set of terminals is on an opposing side of the connecting section from a second connection of the first conductor bus element to the second set of terminals.

13. The electrical outlet assembly of claim 11, wherein a the second conductor bus element is a J-shaped conductor bus element.

14. The electrical outlet assembly of claim 1, wherein a perimeter of the second receptacle space is sized to engage a first type of plug housing; and wherein the single piece molded housing includes one or more projections within the second receptacle space that are spaced from the second outlet core and the perimeter of the second receptacle space so as to be disposed to engage a second type of plug housing that has a smaller engagement perimeter than the first type of plug housing.

15. The electrical outlet assembly of claim 14, wherein side walls of the second receptacle space define a rectangular perimeter; and wherein a first projection and a second projection of the one or more projections are angularly oriented relative to the side walls.

16. The electrical outlet assembly of claim 1, further comprising:

the power distribution unit, including a chassis; and a plurality of outlet modules;

wherein the plurality of outlet modules are fastened to the chassis in an array of outlet modules that is elongate in a first direction; and wherein, for each of the plurality of outlet modules, a first outlet core and a second outlet core are spaced from each other along a second direction different from the first direction.

17. The electrical outlet assembly of claim 16, wherein the first terminal is a first ground terminal of the first-core terminals, the second terminal is a second ground terminal of the second-core terminals, and the first terminal is offset in the first direction from the second terminal.

18. A method of forming an electrical outlet assembly, the method comprising: molding, as a single piece, a housing of an outlet module, wherein the housing includes walls that define a first receptacle space around a first outlet core and a second receptacle space around a second outlet core, wherein the first outlet core extends within the first receptacle space, includes a first outer profile to be received in a first plug housing, and further includes first terminal apertures arranged to receive first plug terminals for connection with first-core terminals of the outlet module, and wherein the second outlet core extends within the second receptacle space, includes a second outer profile shaped to be received in a second plug housing, and further includes second terminal apertures configured to receive second plug terminals for connection with second-core terminals of the outlet module; and securing at least one conductor bus element extending along a wall of the housing outside the first and second receptacle spaces to interconnect a first terminal of the first-core terminals with a corresponding second terminal of the second-core terminals.

19. The method of claim 18, wherein at least one of the walls of the housing includes a deflectable latch tab; and wherein the method further comprises securing a resilient latch member to the housing to biased the deflectable latch tab toward the first outlet core.

20. A power distribution unit comprising:

a plurality of outlet modules arranged in an array that is elongate in a first direction;

wherein each outlet module of the plurality of outlet modules includes:

a housing that defines a first receptacle space around a first outlet core and a second receptacle space around a second outlet core, the first outlet core including first terminal apertures configured to receive first plug terminals for connection with first-core terminals of the outlet module, and the second outlet core including second terminal apertures configured to receive second plug terminals for connection with second-core terminals of the outlet module; and a conductor bus element extending along a wall of the housing outside the first and second receptacle spaces to interconnect a first terminal of the first-core terminals with a corresponding second terminal of the second-core terminals;

wherein a first outlet module is secured adjacent to a second outlet module, relative to the first direction; and wherein, in the first outlet module and in the second outlet module, the first outlet core is spaced apart from the second outlet core transverse to the first direction.

* * * * *